United States Patent
Odawara et al.

(10) Patent No.: US 8,062,450 B2
(45) Date of Patent: Nov. 22, 2011

(54) TAPE SPLICING APPARATUS AND ATTACHING APPARATUS

(75) Inventors: Kozo Odawara, Osaka (JP); Shinjiro Tsuji, Nara (JP); Yuichi Takakura, Osaka (JP); Masayuki Ida, Osaka (JP); Ryouichirou Katano, Osaka (JP)

(73) Assignee: Panasonic Corporation, Osaka (JP)

( * ) Notice: Subject to any disclaimer, the term of this patent is extended or adjusted under 35 U.S.C. 154(b) by 284 days.

(21) Appl. No.: 12/097,098

(22) PCT Filed: Nov. 15, 2006

(86) PCT No.: PCT/JP2006/322723
§ 371 (c)(1), (2), (4) Date: Jun. 12, 2008

(87) PCT Pub. No.: WO2007/069421
PCT Pub. Date: Jun. 21, 2007

(65) Prior Publication Data
US 2009/0288777 A1    Nov. 26, 2009

(30) Foreign Application Priority Data

Dec. 16, 2005 (JP) ................................. 2005-364080
Dec. 16, 2005 (JP) ................................. 2005-364081

(51) Int. Cl.
*B31F 5/00* (2006.01)
(52) U.S. Cl. ....................................................... 156/159
(58) Field of Classification Search ................... 156/159
See application file for complete search history.

(56) References Cited

U.S. PATENT DOCUMENTS 5,810,966 A     9/1998 Semba
2004/0069112 A1*  4/2004 Onoshiro et al. ............... 83/685

FOREIGN PATENT DOCUMENTS

| JP | 48-34459 | 10/1973 |
|---|---|---|
| JP | 48-34460 | 10/1973 |
| JP | 6-16346 | 3/1994 |
| JP | 6-064796 | 3/1994 |
| JP | 7-7024 | 1/1995 |
| JP | 7-297230 | 11/1995 |
| JP | 8-157113 | 6/1996 |
| JP | 2000-289900 | 10/2000 |
| JP | 2003-197677 | 7/2003 |
| JP | 2004-200126 | 7/2004 |
| JP | 2004-202738 | 7/2004 |

OTHER PUBLICATIONS

Machine translation of JP H06-16346 U.*
International Search Report issued Dec. 19, 2006 in the International (PCT) Application of which the present application is the U.S. National Stage.

* cited by examiner

*Primary Examiner* — Philip Tucker
*Assistant Examiner* — Nickolas Harm
(74) *Attorney, Agent, or Firm* — Wenderoth, Lind & Ponack, L.L.P.

(57) ABSTRACT

Provided is an apparatus capable of easily splicing ACF tapes that are thin and are hard to handle. The tape splicing apparatus splices two ACF tapes (210) each having an ACF (212), and includes: a first holding unit that holds one of the ACF tapes (210); a second holding unit that holds the other one of the ACF tapes (210); a positioning unit (115) that positions the ACF tapes (210) to be overlapped in a thickness direction; and a pressing unit (116) that presses the overlapped ACF tapes (210) in the thickness direction.

3 Claims, 22 Drawing Sheets

TAPE SPLICING APPARATUS AND ATTACHING APPARATUS

BACKGROUND OF THE INVENTION

1. Technical Field

The present invention relates to a splicing apparatus that splices tapes, such as ACF tapes. Furthermore, the present invention relates to an attaching apparatus that includes the splicing apparatus for splicing the tapes and that attaches an adhesive material on a board, such as a glass panel. More particularly, the present invention relates to an attaching apparatus that attaches an Anisotropic Conductive Film (ACF) on a terminal portion of the glass panel.

2. Background Art

ACFs have been attached on terminal portions of glass panels for use in liquid crystal displays or plasma displays, and electronic components for image formation have been mounted on the attached ACFs in order to ensure electrical continuity between the terminal portions.

These ACFs have been provided on one side of long resin tapes referred to as base tapes, and have been supplied as the ACF tapes. The ACFs can be attached on the glass panels by pressing the ACF tapes to the glass panels as they are and peeling off only the base tapes.

These ACFs have been automatically attached on the glass panels using ACF attaching apparatuses industrially, and the ACF tapes that are being wound onto reels and that provide the ACFs have been supplied to the ACF attaching apparatuses.

The ACFs required for a glass panel are being lengthened due to upsizing of displays in recent years. Thus, even when the ACF tapes being wound onto the reels are sufficiently long, they may be used up for a short period of time, and replacement frequency of the reels tends to be increased.

Operations of the ACF attaching apparatuses have been suspended when replacing reels with new reels conventionally. After the replacement, an ACF tape has been forwarded from the reel manually, and set through complicated paths for passing the tapes in the ACF attaching apparatus.

However, in the aforementioned method, it takes considerable time to set the ACF tapes. Thus, as illustrated in FIG. 1, a method to be applied to an ACF tape has been suggested. In the method, an additional ACF tape is spliced to an ACF tape that has been used so as to increase the number of turns of the ACF tape per reel (for example, Patent Reference 1). According to this method, the additional ACF tape is spliced to the used ACF tape having an established tape path. As the used ACF tape is taken up, the additional ACF tape passes the tape path. Therefore, a new ACF tape does not have to be set through the tape path.

Patent Reference 1: Japanese Unexamined Patent Application Publication No. 2004-202738

Although Patent Reference 1 discloses a method for splicing ACF tapes, it fails to specifically describe which kind of apparatus splices the tapes.

Furthermore, the ACF tape only measures 1 to 2 mm wide by 50 µm thick approximately, which is ultra thin. Thus, it is supposedly very difficult to splice the tapes manually, and such operation takes a very long time.

Furthermore, when the ACF attaching apparatus is used for splicing these ACF tapes, operations of the ACF attaching apparatus have to be suspended for a long time, and thus little improvement in operation rates of the ACF attaching apparatus can be expected.

In addition, when the ACF tapes are butt-spliced in a straight line as described above, a displacement between the ACF tapes in a width direction frequently occurs, and further it is very difficult to maintain the straight line of the spliced ACF tapes.

Furthermore, when splicing of ACF tapes causes any displacement or distortion, in particular, when a displacement between the spliced ACF tapes in a width direction occurs, there may be a possibility of dropping of the spliced ACF tapes from rollers included in a tape path in the case where the tapes pass through the tape path. Thus, when the ACF tapes are out of the tape path, the tape path needs to be set again manually. Thus, there is no point in splicing the ACF tapes, reducing the operation rates of the ACF attaching apparatus.

The present invention is to solve the aforementioned problems, and a first object is to provide a tape splicing apparatus that can prevent a displacement when splicing tapes together as much as possible and that can mechanically splice tapes for supplying an additional tape while maintaining a straight line of the spliced tapes.

Furthermore, a second object is to provide an attaching apparatus that can precisely splice an additional ACF tape to a tape that is being used and that can promote automation of replacing ACF tapes without suspending operations of the ACF attaching apparatus.

Furthermore, a third object is to provide an attaching apparatus that can continue to stably operate for a long period of time by holding the ACF tapes in volume and through automation of replacing the ACF tapes.

SUMMARY OF THE INVENTION

In order to realize the objects, the tape splicing apparatus according to the present invention splices two tapes each having an adhesive material, and includes: a first holding unit that holds an end of one of the tapes; a second holding unit that holds an end of the other one of the tapes; a positioning unit that positions the ends of the tapes to be overlapped in a thickness direction; and a pressing unit that presses the overlapped ends of the tapes in the thickness direction.

The pressing unit preferably moves one tape closer to the other tape for the pressing.

Furthermore, the tape splicing apparatus may include a cutting unit that cuts the end of the tape.

Furthermore, the tape splicing apparatus may include an ultrasonic splicing unit that ultrasonically splices the tapes pressed by the pressing unit.

Furthermore, the tape splicing apparatus may include a thermal splicing unit that thermally splices the tapes pressed by the pressing unit.

The splicing apparatus having such a configuration can prevent a displacement of tapes in a width direction as much as possible, and precisely and easily splice the tapes while maintaining the straight line of the spliced ACF tapes.

On the other hand, the splicing apparatus can be simply used without the thermal splicing unit or the ultrasonic splicing unit, when using a tape having an adhesive provided on an end of the tape, the adhesive being different from the adhesive material provided on the tape.

Furthermore, a general-purpose tape can be used for making the tape, by adopting an adhesive placing device that places an adhesive tape on an end of a tape. The adhesive placing device includes: two holding units each holding an end of the tape; a cutting unit that cuts the held tape between the two holding units; a shifting unit that spaces out cut portions of the tape; and a splicing unit that bridges a gap between the cut portions of the tape, using an adhesive tape having an adhesive on one side.

Furthermore, when the attaching apparatus is used for attaching the tape on other components, the splicing apparatus may be used for splicing the tapes outside the attaching apparatus.

In order to realize the objects, the tape splicing method according to the present invention splices two tapes each having an adhesive material, and includes: holding an end of one of the tapes; holding an end of the other one of the tapes; positioning the ends of the tapes to be overlapped in a thickness direction; and pressing the overlapped ends of the tapes in the thickness direction.

This method may bring about an advantage similarly as the attaching apparatus and the tape splicing apparatus.

In order to realize the objects, the attaching apparatus according to the present invention attaches, on a board, an adhesive material to be supplied from a tape, and includes: a first holding unit that holds a terminal end of a tape that is being used; a second holding unit that holds a beginning end of an additional tape; a positioning unit that positions the terminal end of the tape that is being used and the beginning end of the additional tape to be overlapped in a thickness direction; and a pressing unit that presses the overlapped ends of the tapes in the thickness direction.

With this, the splicing apparatus can precisely splice the additional tape to the tape that is being used, thus preventing the operation rates of the attaching apparatus from decreasing as quickly as possible.

Preferably, the supplied tape is being wound onto a reel, the second holding unit is fixed to a base, and the base further includes: a reel holding unit that holds the reel to be rotatable; and a locking unit that locks the reel against rotation or unlocks the reel to be rotatable.

The holding of the tape in such a manner enables an additional tape to be set without any slack. Thus, it becomes possible to prevent the operation rates of the attaching apparatus from decreasing.

Preferably, the attaching apparatus includes a supporting unit that support bases, and the positioning unit positions the tapes to be overlapped by shifting the bases supported by the supporting unit.

With this, the attaching apparatus can hold additional tapes, and supply them in order. Thus, stable operations for a long period of time can be realized.

The supporting unit is preferably a magazine that supports the bases in a detachable manner.

With this, the reels and the like can be replaced, with the bases apart from the supporting unit, thus increasing efficiency.

Furthermore, the attaching apparatus preferably includes a plurality of magazines that can be replaced during the operations of the attaching apparatus.

With this, even when a tape is forwarded from a reel held in a magazine, and is supplied to the attaching apparatus, the magazine can be replaced with another magazine. Thus, additional tapes can be loaded to the magazine outside the attaching apparatus during its operation. Since a new magazine after loading of the tapes can be set in the attaching apparatus, there is no need to suspend the operations of the attaching apparatus for setting additional tapes. Thus, the attaching apparatus can operate for a long period of time without being suspended.

Furthermore, the pressing unit preferably moves the tape that is being used and is held by the first holding unit closer to the additional tape that is held by the second holding unit for pressing of the tapes.

With this, when the tape that is being used is moved closer to the additional tape, the tape that has been forwarded can be rewound. Thus, any distortion or elongation in the tapes hardly occurs, so that the two tapes can be pressed precisely.

Furthermore, when the pressing unit presses the additional tape, the attaching apparatus preferably includes a tension maintaining unit that maintains a fixed tension of the additional tape.

With this, since the tape that has a fixed tension and that is being used can be moved closer to the additional tape, the two tapes can be pressed precisely.

Furthermore, the attaching apparatus may include a cutting unit that cuts the end of the tape for separation from the reel.

With this, the end of the tape that is not used for splicing can be shortened, thus enabling reduction of cases where such free end negatively affects the attaching apparatus, as quickly as possible.

In order to realize the objects, the tape adding method according to the present invention is for adding a tape to an attaching apparatus that attaches an adhesive material on a board, the adhesive material being supplied from the tape. The method includes: holding a terminal end of a tape that is being used; holding a beginning end of an additional tape; positioning the ends of the tapes to be overlapped in a thickness direction; and pressing the overlapped ends of the tapes in the thickness direction for splicing the tapes.

This method may bring about an advantage similarly as the aforementioned apparatuses and the method.

Furthermore, the tape adding method preferably includes forwarding a predetermined length of the additional tape, according to the spliced tape that is being used, and attaching the adhesive material on a temporary component different from the board.

With this, the position of the end of the adhesive material can be precisely obtained.

Furthermore, the tape adding method desirably includes detecting an end of the adhesive material included in the tape that is being used.

With this, the time when a process for splicing tapes starts can be precisely obtained.

With the present invention, even ultra-thin tapes can be spliced easily and precisely. Furthermore, a terminal end of a tape that is being used and a beginning end of an additional tape can be spliced precisely.

DETAILED DESCRIPTION OF THE INVENTION

Next, an embodiment of a splicing apparatus 110 according to the present invention is described.

First, an ACF tape 210 that is one of tapes to be spliced in the present embodiment is described.

Figure 1:
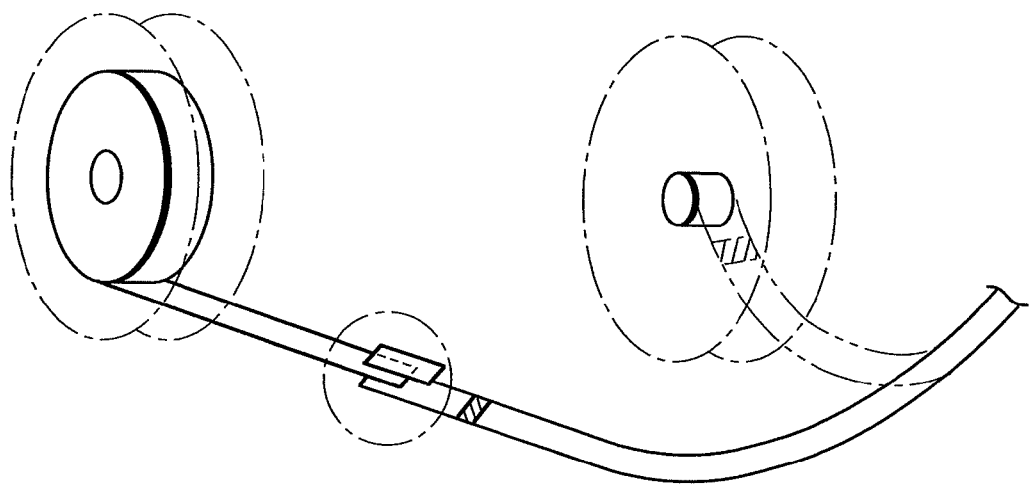
FIGS. 1(a) and 1(b) are perspective views illustrating a conventional example of splicing of ACF tapes.
Figure 1:
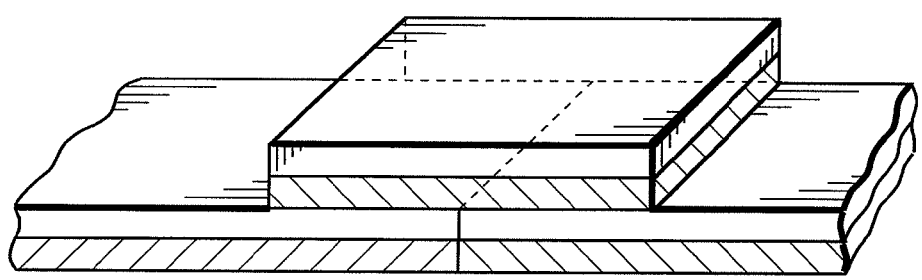
Figure 2:
FIG. 2(a) illustrates an enlarged side view of an end of the ACF tape 210.
FIG. 2(b) illustrates a side view obtained by further enlarging FIG. 2(a).
Figure 2:
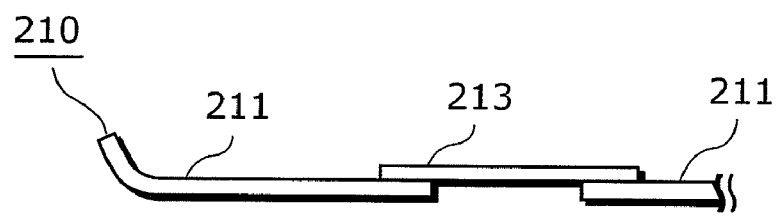

FIG. 2(a) illustrates an enlarged side view of an end of the ACF tape 210, and FIG. 2(b) illustrates a side view obtained by further enlarging FIG. 2(a).

As illustrated in FIG. 2(a), the ACF tape 210 includes a base tape 211, and an Anisotropic Conductive Film (ACF) 212 provided on one side of the base tape 211.

Furthermore, only the base tape 211 is present at the end of the ACF tape 210, without the ACF 212.

The base tape 211 is a long tape measuring 1 to 2 mm wide by several tens of μm thick approximately. Furthermore, the base tape 211 needs to hold the ACF 212 when being unused, and when applying the ACF 212, it is necessary to peel off the ACF 212 from the base tape 211. Thus, drawn polypropylene, polytetrafluoroethylene, polyethylene terephthalate, and the like are used as the materials for the base tape 211.

The ACF 212 is made of a material formed by spreading fine conductive particles in a film insulating resin material. Applying pressure and temperature to the ACF 212, the film can electrically connect to a direction where the pressure is given, via conductive particles between electrodes, simultaneously when the tape is attached. Furthermore, the film can maintain insulation to other directions.

As illustrated in FIG. 2(b), in a beginning end of the ACF tape 210, the base tape 211 is separated in a length direction, and an adhesive tape 213 bridges a gap in the separated portion.

This adhesive tape 213 is a tape having an adhesive on one side that has an adhesive force sufficient to connect to the base tape 211, and has a width equal to or less than that of the base tape 211.

As described above, when the adhesive tape 213 is positioned in-between the two lengths of the base tape 211, the terminal end of the ACF tape 210 includes a portion of the base tape 211 having no adhesive force. With this, it becomes easy to hold the end of the ACF tape 210.

Next, a jig 300 that serves as an adhesive placing device for placing the adhesive tape 213 at the end of the base tape 211 is described.

FIGS. 3(a)-3(g) simply illustrate side views of the jig 300 to show operations using the jig 300 according to the present embodiment.

As illustrated in the drawings, the jig 300 includes: two tape holders 301 that hold the base tape 211; a shifter 307 that can space out and contact the tape holders 301; a first cutter 302 as a tool for cutting the base tape 211; two second cutters 303 that cut the adhesive tape 213; adhesive tape mounters 304 that mount the adhesive tape 213 on a predetermined position; and a presser 305 that presses the adhesive tape 213 to the base tape 211.

Each of the tape holders 301 needs to hold only one side of the base tape 211. This is because the adhesive tape 213 needs to be pressed from the other plane. In the present embodiment, the tape holder 301 includes an absorbing opening (not illustrated) for vacuum absorption on the top, and a path that connects the absorbing opening to the vacuum system.

Note that as long as the tape holder 301 can fix the base tape 211, not only the vacuum absorption but also other methods may be used.

Furthermore, the two tape holders 301 can be spaced out in a length direction of the ACF tape 210, while the tape holders 301 hold the base tape 211.

The first cutter 302 is fixed at an approximate center of the presser 305, with a cutting tool projecting downward. This first cutter 302 can cut the base tape 211 by sandwiching the base tape 211 with one of the tape holders 301.

The second cutters 303 are fixed at both ends of the presser 305, with respective cutting tools projecting downward. These second cutters 303 cut the adhesive tape 213 by sandwiching the adhesive tape 213 between the adhesive tape mounters 304 and the second cutters 303, in order to separate the adhesive tape 213 from the adhesive tape mounters 304.

The adhesive tape mounters 304 mount the adhesive tape 213 on a predetermined position, can freely appear vertically with respect to a pressing direction of the presser 305, and can be shifted in the pressing direction with the presser 305.

The presser 305 can freely be apart from and contact the tape holders 301, provide a cutting force for the first cutter 302 and the second cutters 303, and press and attach, to the base tape 211, the adhesive tape 213 mounted on the predetermined position.

Next, a method for attaching the adhesive tape 213 using the jig 300 is described.

Figures 3A, 3B, 3C, 3D, 3E, 3F, 3G:
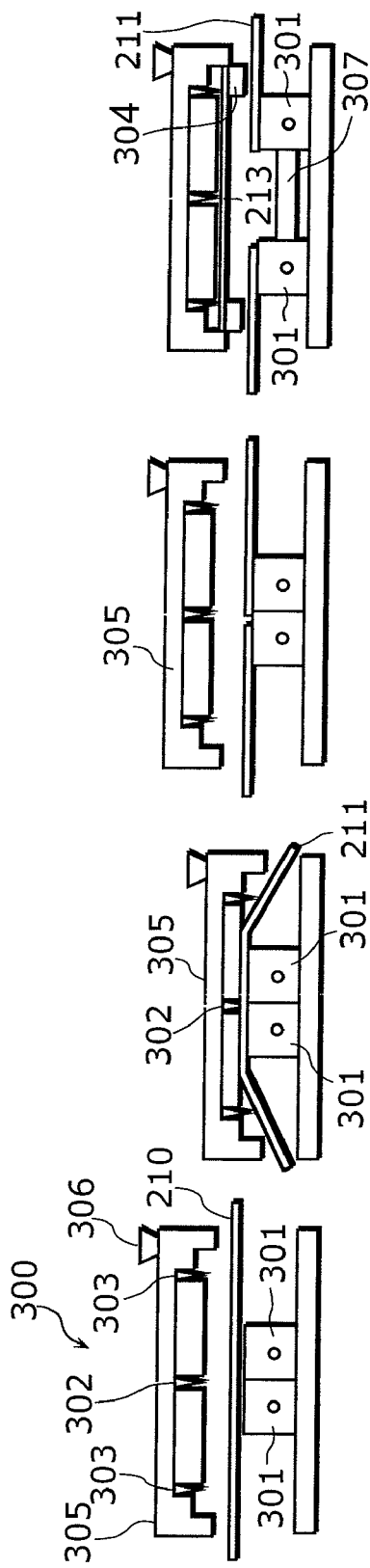
FIGS. 3(a)-3(g) simply illustrate enlarged side views of a jig and operations using the jig according to the present embodiment.

As illustrated in FIG. 3(a), the ends of the ACF tape 210 where only the base tape 211 is present are placed at the two tape holders 301 so that the length direction of the ACF tape 210 matches an alignment direction of the two tape holders 301 that are contacting with each other. Then, the tape holders 301 hold the base tape 211 by vacuum absorption.

Next, as illustrated in FIG. 3(b), the presser 305 is pressed to the tape holders 301, and the first cutter 302 cuts the base tape 211. The both ends of the presser 305 include portions that project to a direction of the tape holders 301. When the base tape 211 is cut, the projecting portions protect the base tape 211 from the second cutters 303 by pressing down the base tape 211.

Next, as illustrated in FIG. 3(c), the presser 305 is returned to the original position.

Next, as illustrated in FIG. 3(d), the tape holders 301 are spaced out in the length direction of the ACF tape 210, using the shifter 307. Since the base tape 211 cut by the first cutter 302 is held by the tape holders 301, the base tape 211 is separated by spacing out the tape holders 301. Furthermore, the adhesive tape mounters 304 are projected when, before, or after separating the base tape 211.

Next, as illustrated in FIG. 3(e), causing a third cutter 306 to slide, the adhesive tape 213 is cut in the length direction to match the width of the base tape 211.

Next, as illustrated in FIG. 3(f), the presser 305 is pressed to the tape holders 301, together with the adhesive tape mounters 304. With this, the adhesive tape 213 is attached to the separated base tape 211 so as to bridge the gap in the separated portion. Furthermore, in this pressing process, the second cutters 303 cut the adhesive tape 213.

Next, as illustrated in FIG. 3(g), the attaching of the adhesive tape 213 ends when the presser 305 and the adhesive tape mounters 304 are withdrawn from the tape holders 301.

Using the jig 300 and the method described above, it becomes possible to precisely and easily attach the adhesive tape 213 in-between the end of the ACF tape 210 that is ultra thin. The ACF tape 210 for general-purpose can also be applied to the splicing apparatus 110 to be described hereinafter, using the adhesive tape 213 for general-purpose.

FIGS. 4 to 10 are perspective views illustrating the splicing apparatus 110 that is installed in an attaching apparatus 100 that attaches the ACF 212 supplied from the ACF tape 210 on a glass panel 200.

As illustrated in the drawings, the splicing apparatus 110 is an apparatus that splices a beginning end of the additional ACF tape 210 and a terminal end of the ACF tape 210 that is being used, using the attaching apparatus 100.

As illustrated in the drawings, the splicing apparatus 110 in the present embodiment includes a first holding unit 111, a first cutting unit 113, a second holding unit 114, a second cutting unit 118, a positioning unit 115, and a pressing unit 116.

The first holding unit 111 holds the ACF tape 210 by nipping the terminal end of the ACF tape 210 that is to be used up, and includes two nip units 112.

Furthermore, the two nip units 112 can be projected so that the respective nip units 112 can be positioned on both sides of the ACF tape 210 in a thickness direction, and further can be taken into the first holding unit 111 when the nip units 112 do not nip the ACF tape 210.

Furthermore, disc-like elastic elements 119 are provided at faces that are closer to the ends of the two nip units 112 and opposed to the two nip units 112. The elastic elements 119 can hold the ACF tape 210 strongly without any displacement.

Note that it is possible to optionally select the presence and absence of or the shape of the elastic elements 119.

The first cutting unit 113 is provided above the elastic elements 119. One of the nip units 112 nips the ACF tape 210, while the other can cut the ACF tape 210 using the nipping force of the nip units 112. More specifically, the one of the nip units 112 is equipped with a cutting tool, and the other of the nip units 112 is equipped with a plate-like component that accepts the cutting tool. Using the force for nipping the ACF tape 210, it is possible to cut the ACF tape 210 at the reel side, not the elastic element 119 side.

The second holding unit 114 is fixed to a holding plate 131 to be described later, and holds the beginning end of the additional ACF tape 210 to be held by a reel 214 of which shaft is supported by the holding plate 131 by nipping it.

In the holding structure of the second holding unit 114, the ACF tape 210 is nipped between a cylinder 122 and a holding base 121, the cylinder 122 being urged in a direction toward a holding base 121 to be protruded, and the holding base 121 being fixed by the holding plate 131.

The pressing unit 116 presses, in a thickness direction, the ends of the ACF tapes 210 that are overlapped by the positioning unit 115 to be described later, and includes two pressing elements 117. Each of the ends of the pressing elements 117 includes a concave unit 123 and a convex unit 124 that are fitted together. Then, the overlapped ACF tapes 210 are nipped between an underside of the concave unit 123 and an end surface of the convex unit 124, and pressure is given.

In the present embodiment, the adhesive tape 213 is provided at the beginning end of the ACF tape 210, and given only the pressure, it becomes possible to splice the ACF tapes 210.

Furthermore, two slits 125 are provided at each of the ends of the pressing elements 117. The slit 125 has the same width as that of the ACF tape 210, and can pass through the ACF tape 210. When the ACF tapes 210 are pressed, the slit 125 guides the ACF tapes 210, and positions (aligns) the ACF tapes 210 in a width direction precisely.

The second cutting unit 118 includes: a cutting tool provided under the pressing element 117 at the additional ACF tape 210 side; and a receiving plate placed in the back side of the additional ACF tape 210. When the pressing unit 116 presses the ACF tapes 210, the second cutting unit cuts the additional ACF tape 210 at the second holding unit 114 side, between the cutting tool and the receiving plate.

Figure 11:
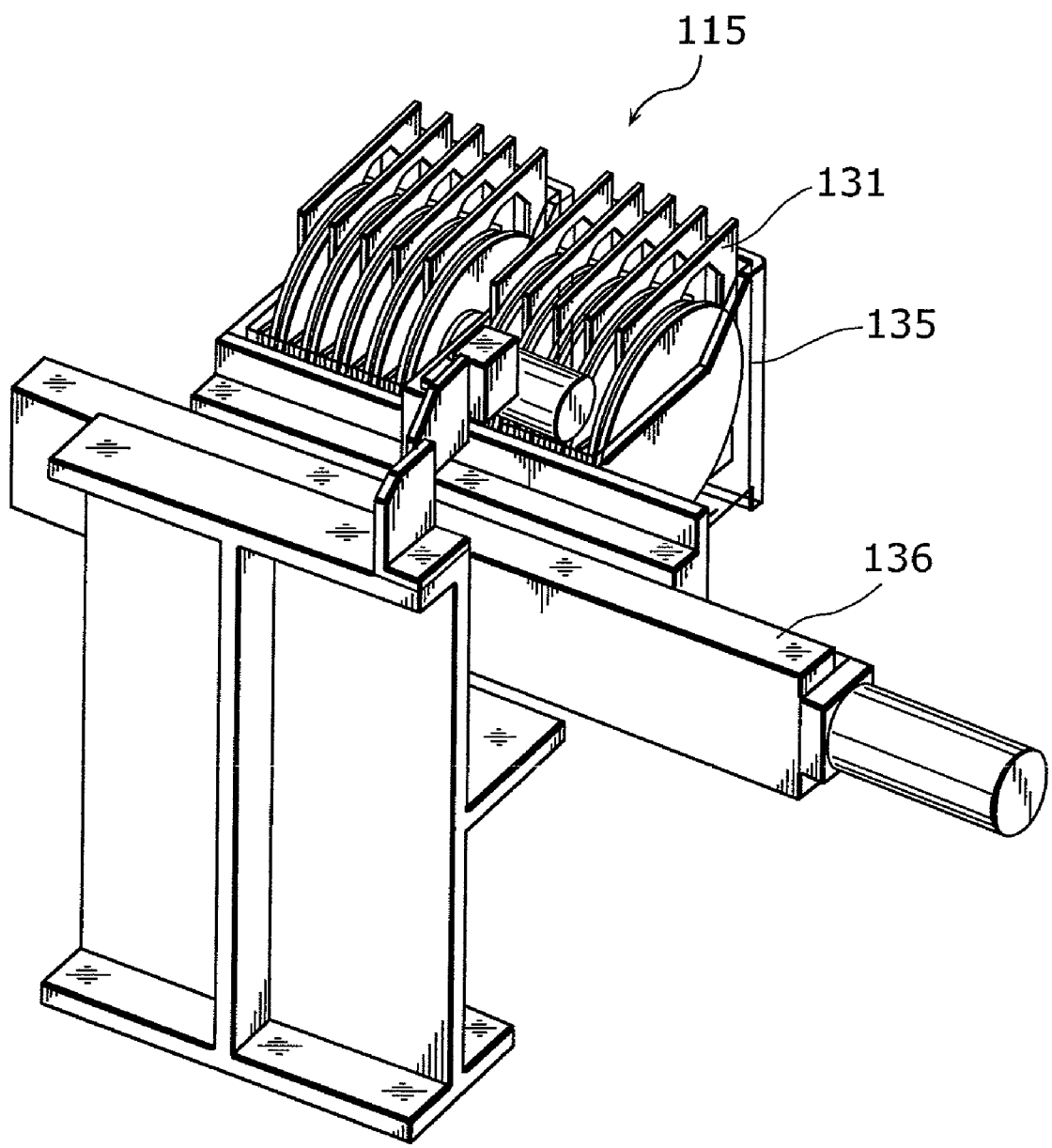
FIG. 11 is a perspective view only illustrating a positioning unit (except for a plate fixing unit).

FIG. 11 is a perspective view illustrating only the positioning unit 115 (except for a plate fixing unit 137).

The positioning unit 115 overlaps, in a thickness direction, the ends of the ACF tapes 210 respectively held by the first holding unit 111 and the second holding unit 114. As illustrated in the drawing, the positioning unit 115 includes the holding plates 131, a magazine 135 that holds the holding plates 131, a magazine shifting unit 136, and the plate fixing unit 137 (not illustrated in FIG. 11).

Figure 12:
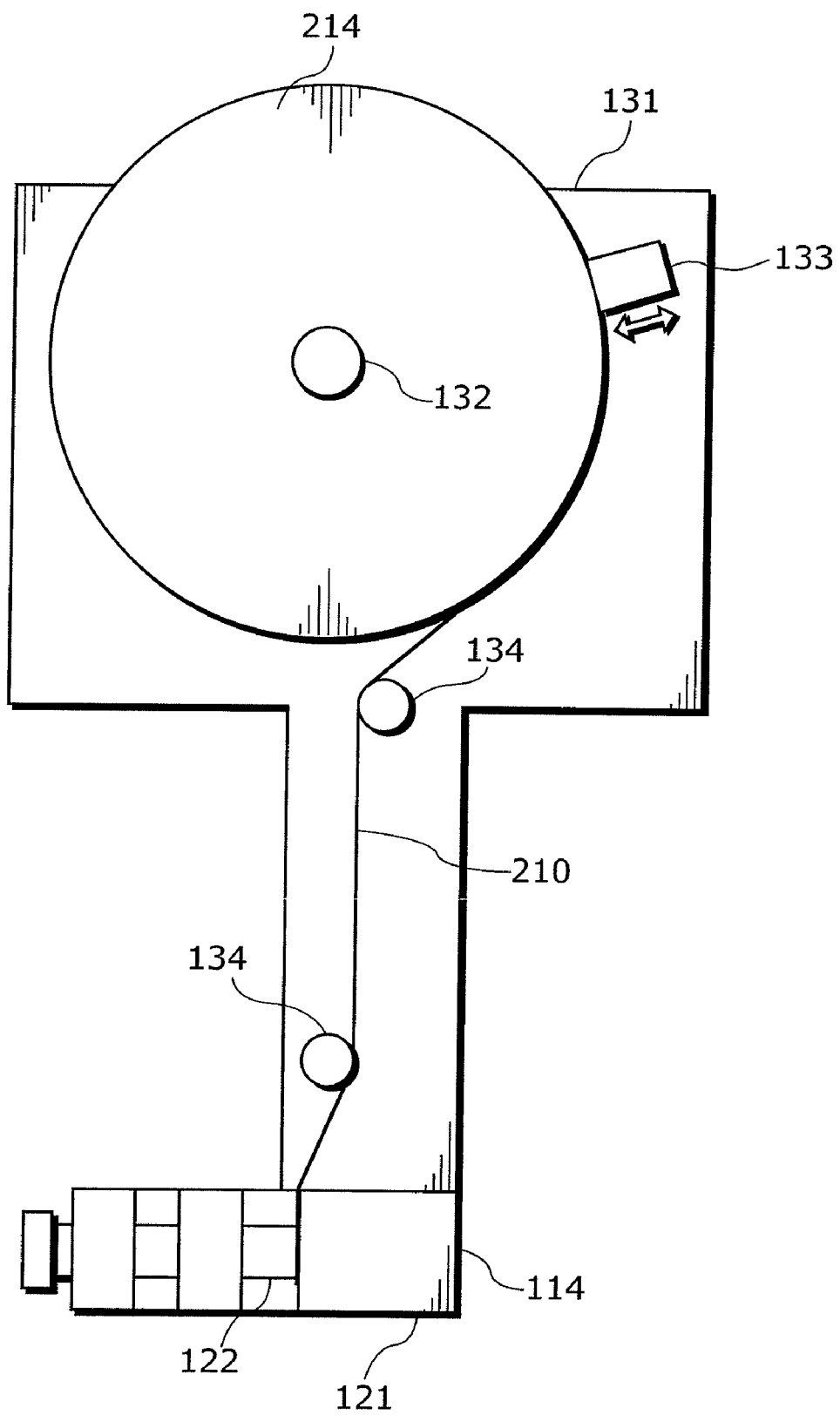
FIG. 12 is a plan view illustrating that a holding plate supports a reel and a second holding unit holds a beginning end of the ACF tape forwarded from the reel.

FIG. 12 is a plan view of the holding plate 131, and illustrates a state where the holding plate 131 supports a shaft of the reel 214 and the second holding unit 114 holds the beginning end of the ACF tape 210 forwarded from the reel 214.

The holding plate 131 illustrated in the drawing is approximately T-shaped, and the second holding unit 114 is fixed at the bottom portion of the holding plate 131. Furthermore, the holding plate 131 includes a shaft supporting unit 132, a locking unit 133, and two rollers 134.

The shaft supporting unit 132 supports the reel 214 to be rotatable on the holding plate 131.

The locking unit 133 is slidably fixed on the holding plate 131 to be apart from and contact a peripheral line of the reel 214. When the locking unit 133 is apart from the peripheral line of the reel 214, the locking unit 133 can unlock the reel 214 to be rotatable, whereas when the locking unit 133 contacts the peripheral line of the reel 214, the locking unit 133 can lock the reel 214 against rotation.

Note that without contacting the peripheral line of the reel 214, the locking unit 133 may be disposed on a position other than the holding plate 131, and be connected to the shaft supporting unit 132 of the reel 214 through a belt and the like so as to lock the reel 214 against rotation.

The rollers 134 define a path of the ACF tape 210 forwarded from the reel 214, and are supported by the shaft of the holding plate 131 to be rotatable.

With the aforementioned configuration, the beginning end of the ACF tape 210 forwarded from the reel 214 can be held between the two rollers 134 with a proper tape tension that is optionally set. This is possible because the second holding unit 114 can fix the beginning end of the ACF tape 210, the locking unit 133 can limit the rotation of the reel 214, and the second holding unit 114 and the reel 214 are fixed by one of the holding plates 131.

The magazine 135 is a frame that holds five of the holding plates 131, and can hold the five holding plates 131 parallel and at regular intervals, the ACF tape 210 and the reel 214 being fixed in each of the holding plates 131.

The magazine shifting unit 136 has a mechanism capable of moving the magazine 135 in a thickness direction of the holding plates 131 parallel, using ball screws. Furthermore, a feedback control of an encoder allows the position of the magazine 135 to be controlled to a predetermined precision.

The plate fixing unit 137 (see FIGS. 4 to 10) fixes a position of the holding plate 131 by nipping the bottom portion of the holding plate 131 except for when the magazine 135 is shifted. Furthermore, when the magazine 135 is shifted, the plate fixing unit 137 is also shifted, thus releasing the fixed position of the holding plates 131.

The positioning unit 115 overlaps the ends of the ACF tapes 210 in a thickness direction as follows.

In other words, the magazine shifting unit 136 shifts the magazine 135, and positions the ACF tape 210 held by the holding plate 131 to the ACF tape 210 held by the first holding unit 111 to be overlapped. Furthermore, the plate fixing unit 137 fixes the holding plate 131 to position it precisely.

As described above, it becomes possible to precisely overlap the ends of the ACF tapes 210 in a thickness direction at a predetermined interval.

Next, splicing processes of the ACF tapes in the splicing apparatus having the aforementioned configuration are described.

Figure 4:
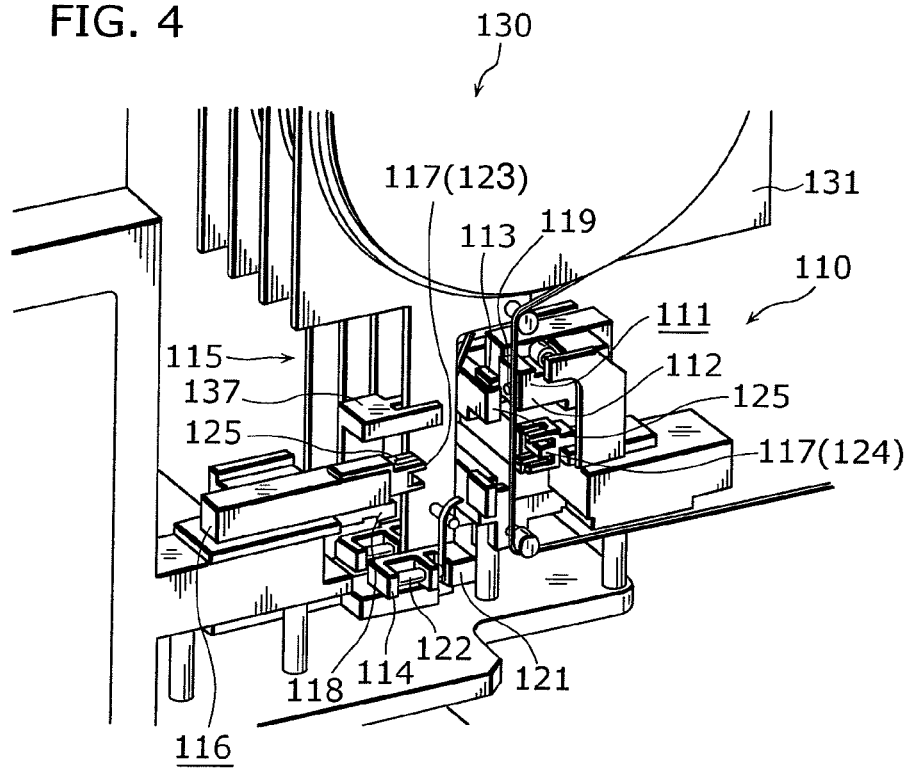
FIG. 4 illustrates an enlarged perspective view of a splicing unit and a supplying unit.
Figure 5:
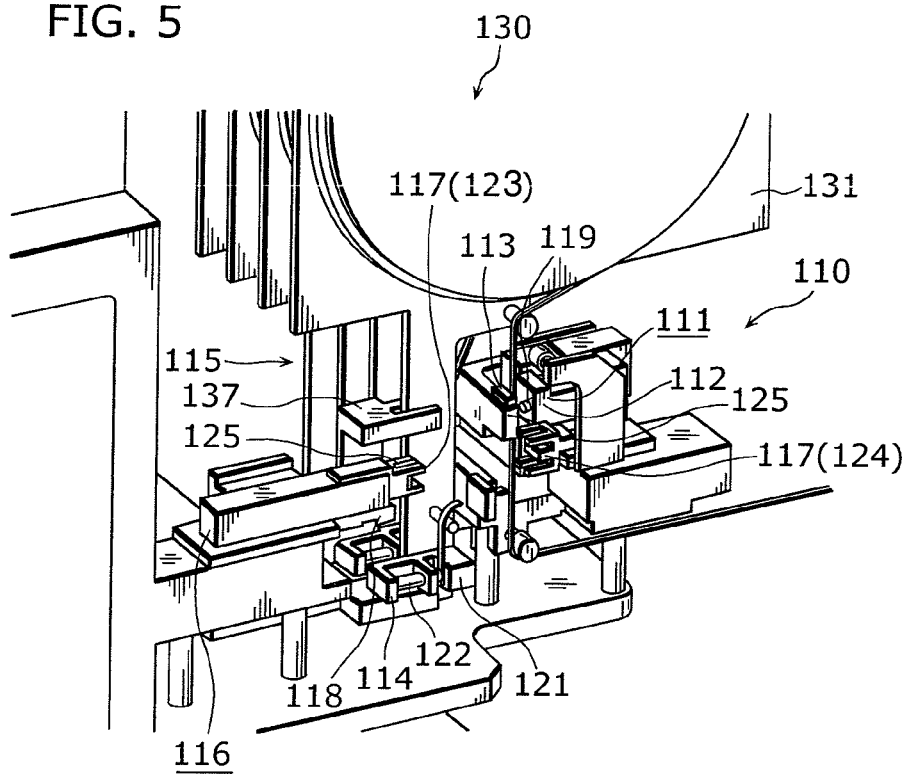
FIG. 5 illustrates an enlarged perspective view of a splicing unit and a supplying unit.
Figure 6:
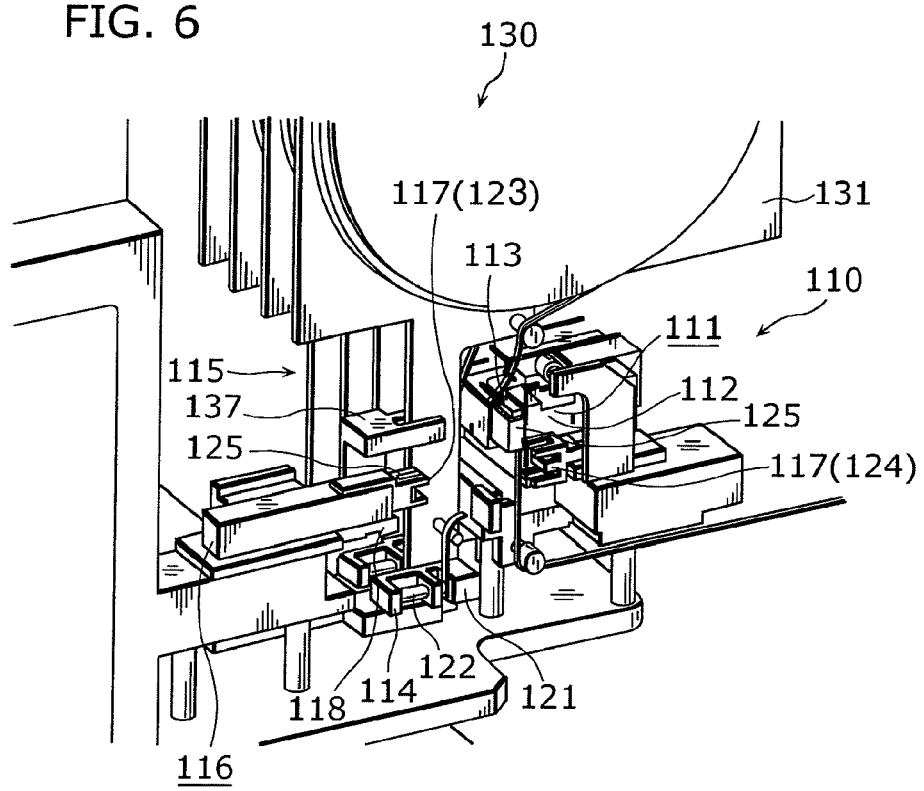
FIG. 6 illustrates an enlarged perspective view of a splicing unit and a supplying unit.

As illustrated in FIGS. 4 to 6, the first holding unit 111 protrudes first, and nips and holds the end of the ACF tape 210 that is being used. At the same time, the first cutting unit 113 cuts a portion of the ACF tape 210 closer to the reel 214.

Figure 7:
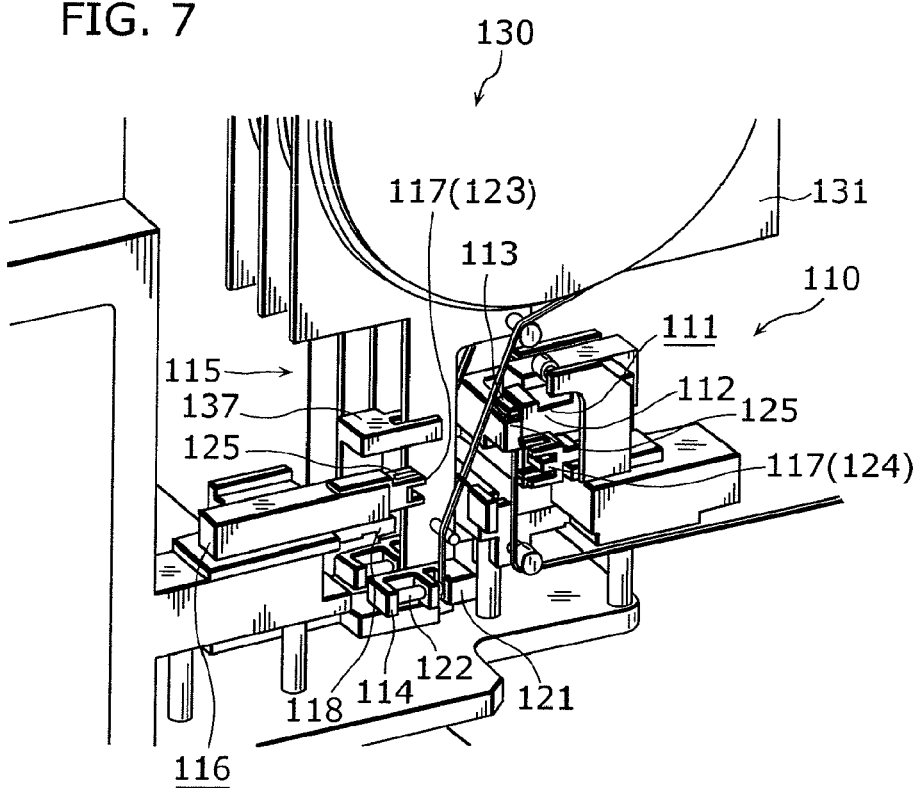
FIG. 7 illustrates an enlarged perspective view of a splicing unit and a supplying unit.

Next, as illustrated in FIG. 7, after the fixed position of the holding plate 131 is released by sliding the plate fixing unit 137, the magazine shifting unit 136 operates so that the next holding plate 131 is set to a predetermined position. Then, the plate fixing unit 137 is shifted again, and the new holding plate 131 is fixed.

With the aforementioned processes, it becomes possible to overlap an end of the ACF tape 210 that is being used and an end of the additional ACF tape 210 precisely in a thickness direction at a predetermined interval.

Figure 8:
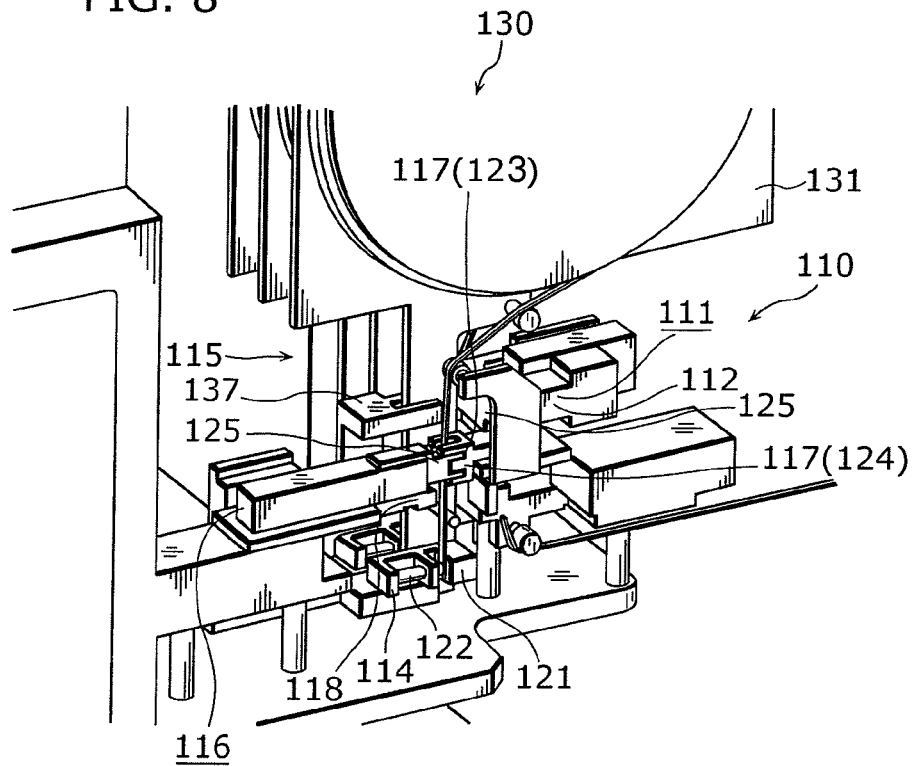
FIG. 8 illustrates an enlarged perspective view of a splicing unit and a supplying unit.

Next, as illustrated in FIG. 8, the pressing element 117 at the additional ACF tape 210 side is shifted to contact the additional ACF tape 210, while the pressing element 117 at the opposite side presses the ACF tape 210 that is being used to the additional ACF tape 210 by pulling the ACF tape 210 that is being used to splice the ACF tapes 210 together.

Note that although the ACF tape 210 that is being used is illustrated halfway, this is only a matter of making the drawings. Actually, the cut end of the ACF tape 210 is nipped by the two nip units 112.

In this process, when the ACF tape 210 that is being used is forwarded, the proper tape tension can be maintained using a dancer roller that is not illustrated. In contrast, since the ACF tape 210 that is tightened between the second holding unit 114 and the locked reel 214 is not forwarded, it becomes possible to splice the ACF tapes 210 while preventing a displacement of the ACF tapes 210 in a width direction.

Figure 9:
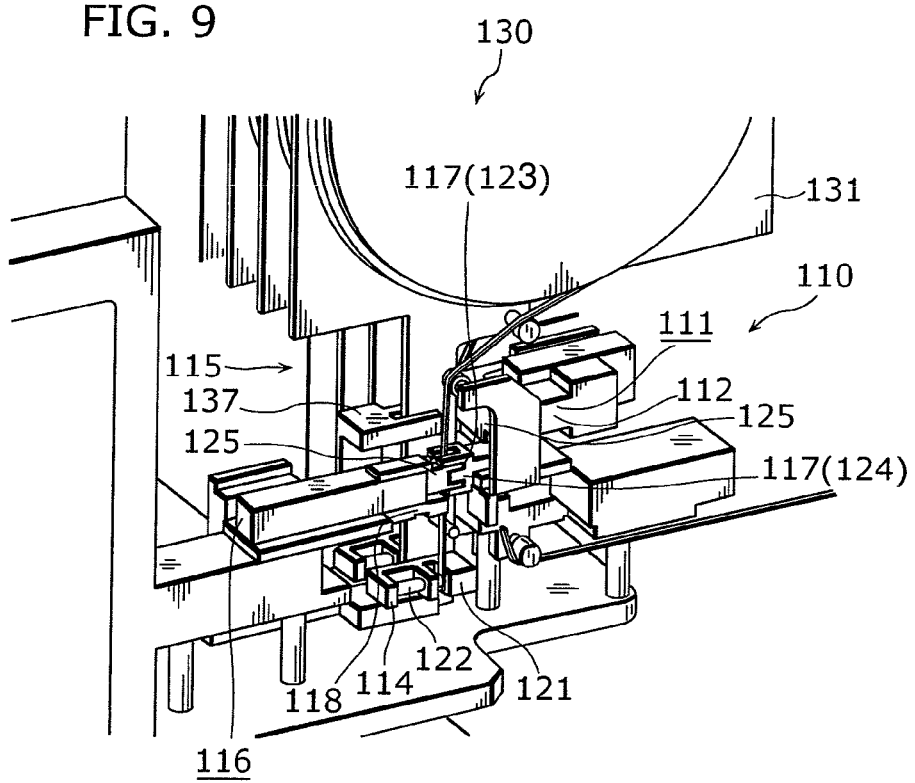
FIG. 9 illustrates an enlarged perspective view of a splicing unit and a supplying unit.
Figure 10:
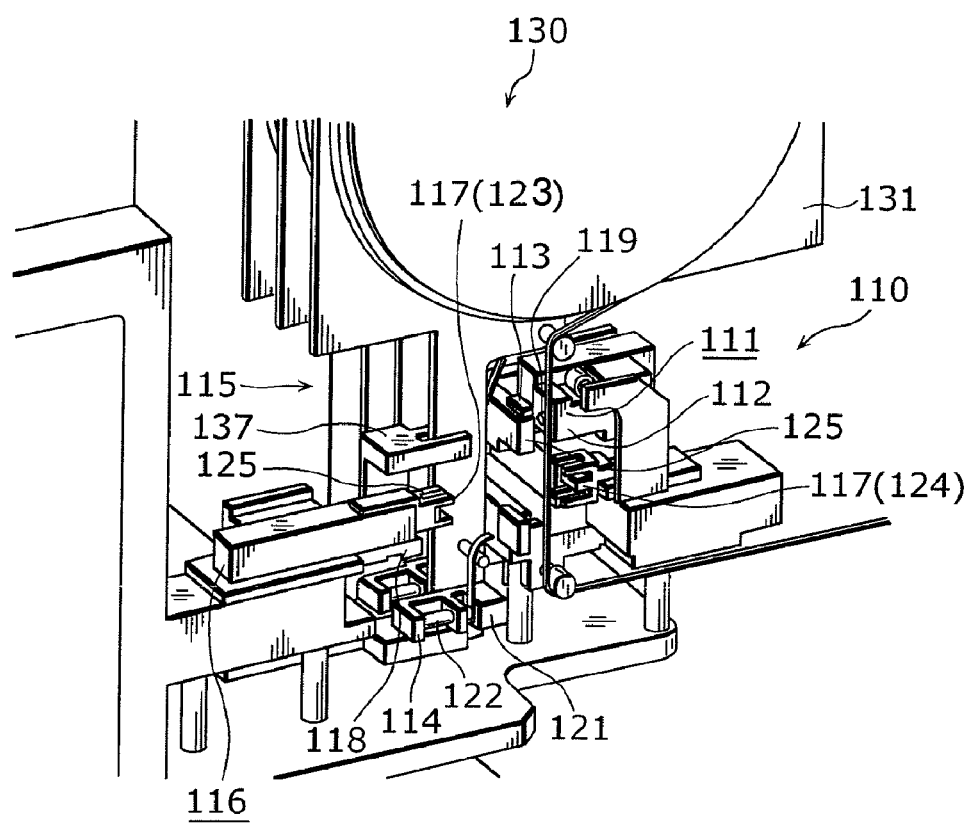
FIG. 10 illustrates an enlarged perspective view of a splicing unit and a supplying unit.

Furthermore, as illustrated in FIG. 9, the second cutting unit 118 cuts the additional ACF tape 210 at the second holding unit 114 side.

Finally, the ACF tape 210 is released by setting the first holding unit 111 and the pressing unit 116 apart.

Figure 13:
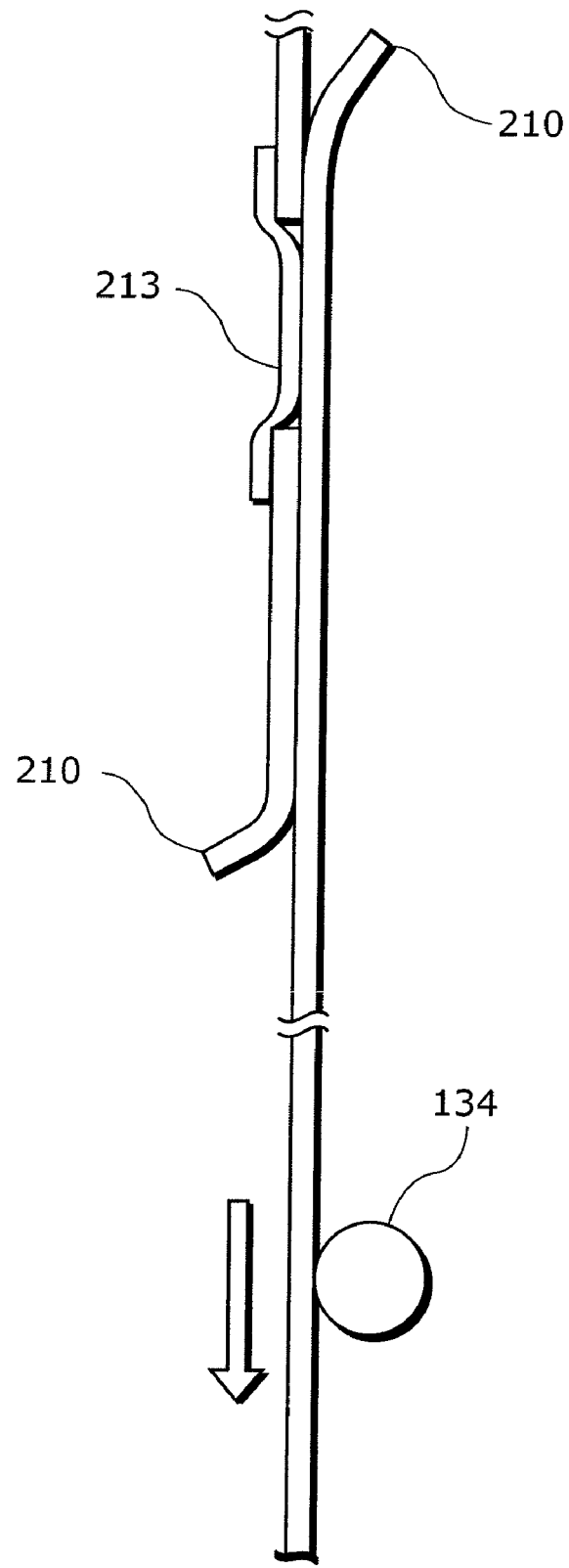
FIG. 13 illustrates a side view of the ACF tapes to be spliced.

With the splicing apparatus and the splicing method described above, as illustrated in FIG. 13, it is possible to precisely splice the ends of the ACF tapes 210 that are ultra thin while preventing the displacement of the ACF tapes 210 in a width direction.

Figure 14:
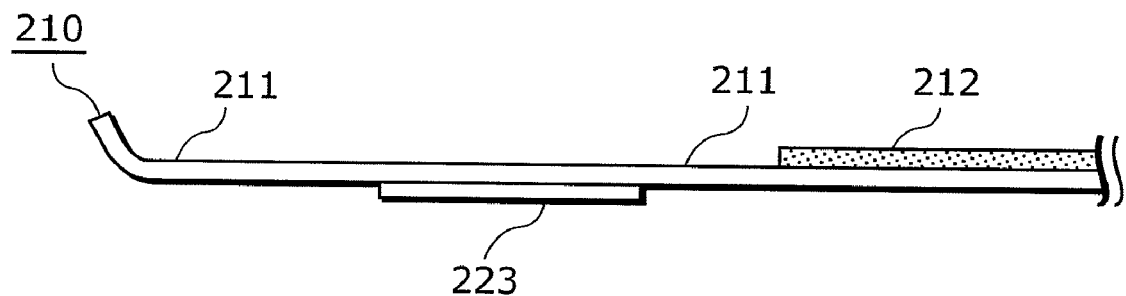
FIG. 14(a) illustrates a side view enlarging an end of another ACF tape.
FIG. 14(b) illustrates a side view of an end of another ACF tape.
Figure 14:
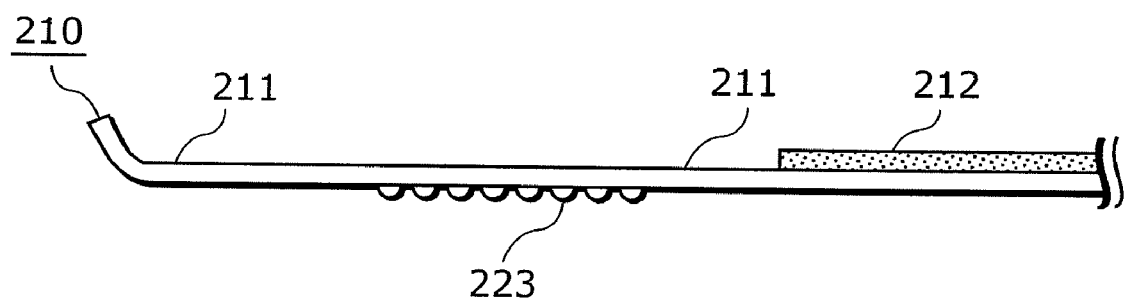

Although the ACF tape 210 includes the adhesive tape 213 for bridging a gap at the end, the present invention is not limited to this. As illustrated in FIG. 14(a), the ACF tape 210 may include a double-faced tape 223 on one side of the ACF tape 210, opposite to the ACF 212 at the end of the ACF tape 210. The double-faced tape 223 has adhesive forces on both sides. Furthermore, the ACF tape 210 may include an adhesive 233 applied on the end of the ACF tape 210 as illustrated in FIG. 14(b).

For example, the jig 300 may be used to provide the double-faced tape 223 at the ends of the ACF tape 210. The use of the jig 300 makes the shifter 307 unnecessary, allowing the tape holders 301 not to be shifted. In other words, the base tape 211 is not cut in FIG. 3(b). Thus, the process in FIG. 3(d) becomes unnecessary. Assume that the double-faced tape 223 is used instead of the adhesive tape 213 in FIG. 3(e), (f), and (g). In such a case, it becomes possible to place the double-faced tape 223 on the ends of the ACF tape 210. Note when the double-faced tape 223 is placed on the ACF tape 210, a protective film (not illustrated) that is detachable from the double-faced tape 223 may be provided opposite to the double-faced tape 223. With this, the presser 305 does not contact the double-faced tape 223, enabling to facilitate an operation of placing the double-faced tape 223 on the ACF tape 210.

Furthermore, although the ACF tape 210 is cut for releasing the ACF tape 210 from the second holding unit 114, the ACF tape 210 may be released by causing the second holding unit 114 to stop holding the ACF tape 210.

Furthermore, although the ACF tapes 210 can be spliced using the adhesive force and pressing by the pressing unit 116, the present invention is not limited to this. For example, an ultrasonic transducer or a thermal splicing unit may be provided at the end of the pressing element 117 so that the ends of the ACF tapes 210 may be ultrasonically or thermally spliced.

Although the present embodiment exemplifies the ACF tape 210 as a tape, the tape is not limited to this. For example, the ACF tape 210 may be a tape including a Non Conductive Film (NCF) and the like.

Next, the present embodiment of the attaching apparatus 100 according to the present invention is described.

Figure 15:
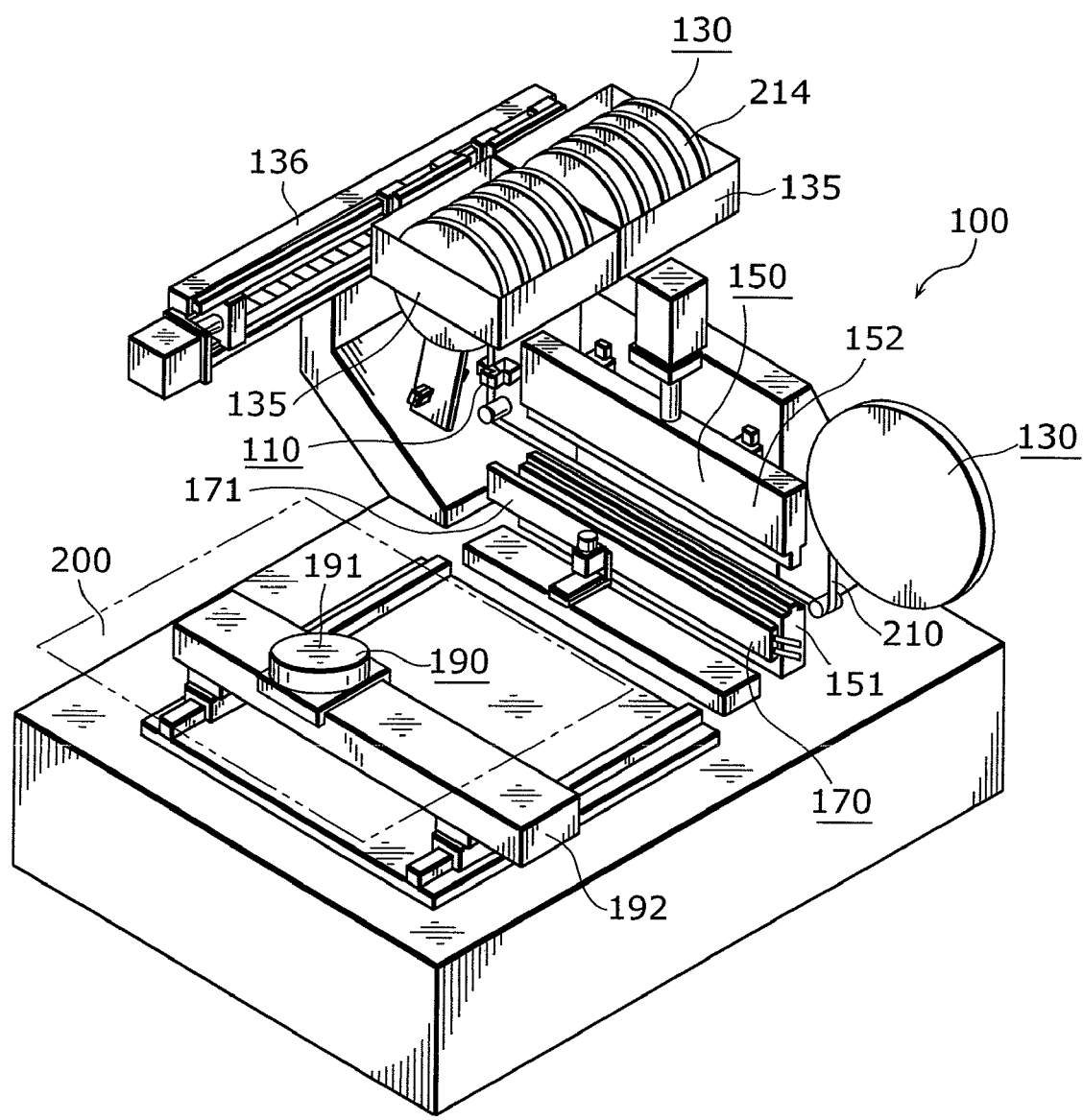
FIG. 15 is a perspective view illustrating an internal configuration of the attaching apparatus according to the present embodiment.
Figure 16:
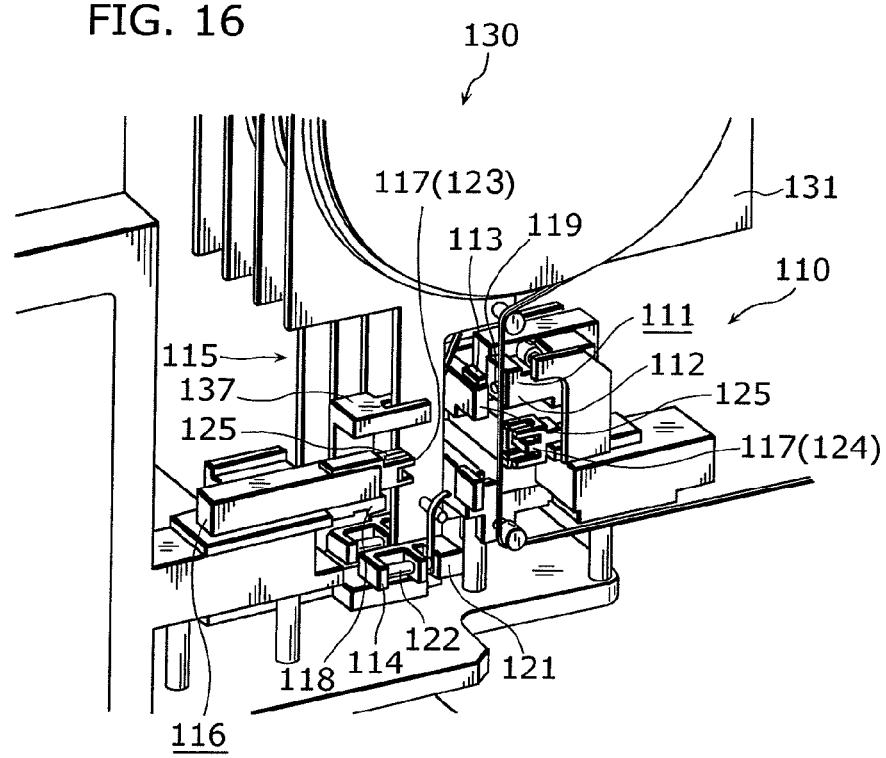
FIG. 16 illustrates an enlarged perspective view of a splicing unit and a supplying unit.
Figure 17:
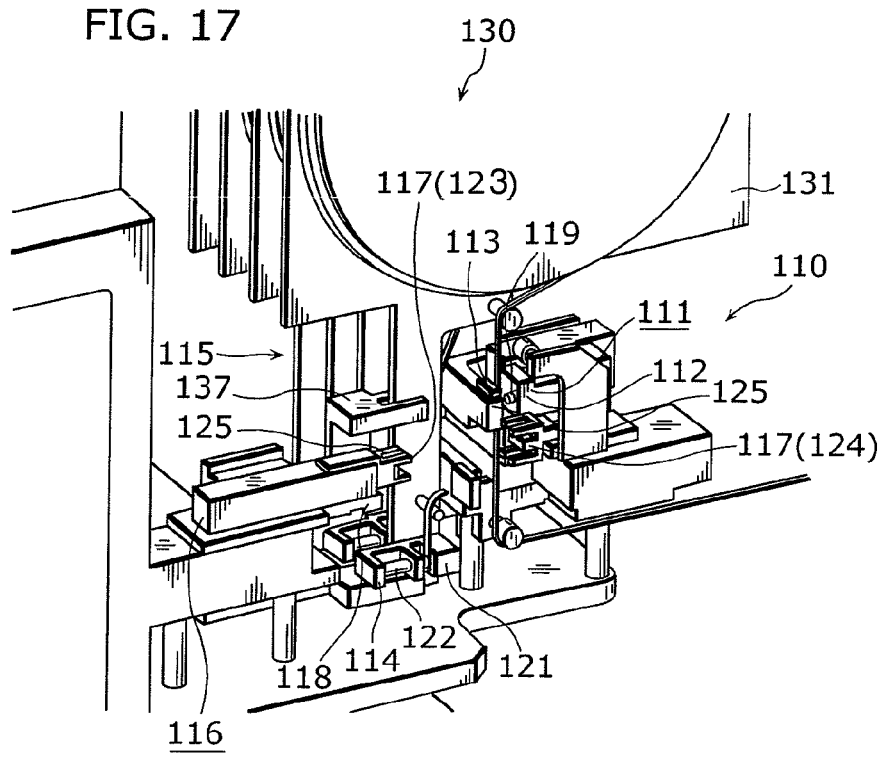
FIG. 17 illustrates an enlarged perspective view of a splicing unit and a supplying unit.
Figure 18:
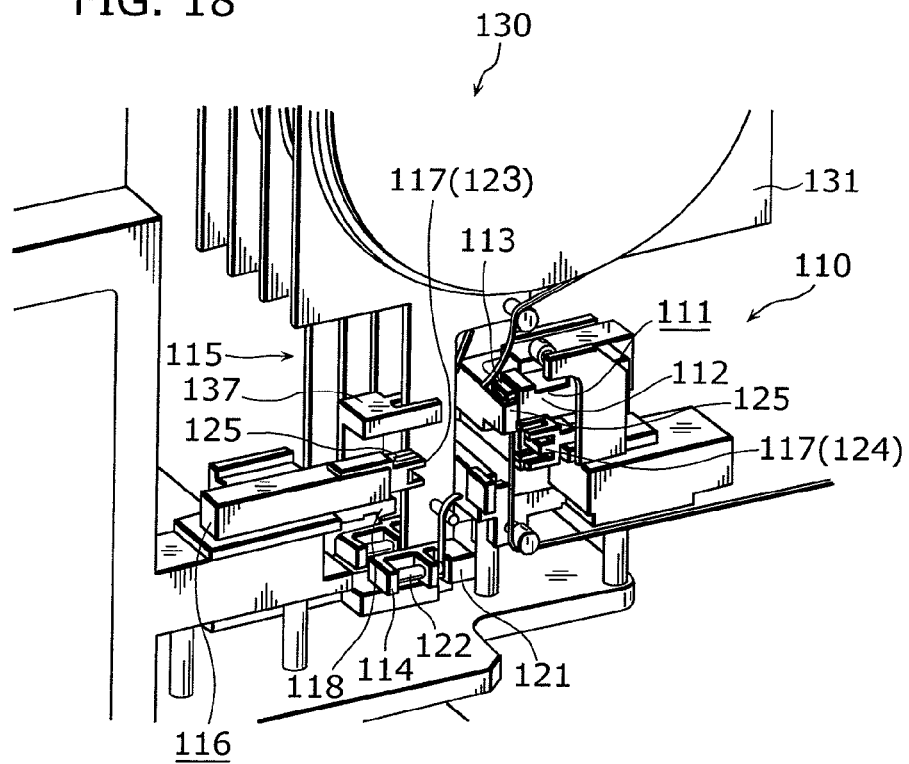
FIG. 18 illustrates an enlarged perspective view of a splicing unit and a supplying unit.
Figure 19:
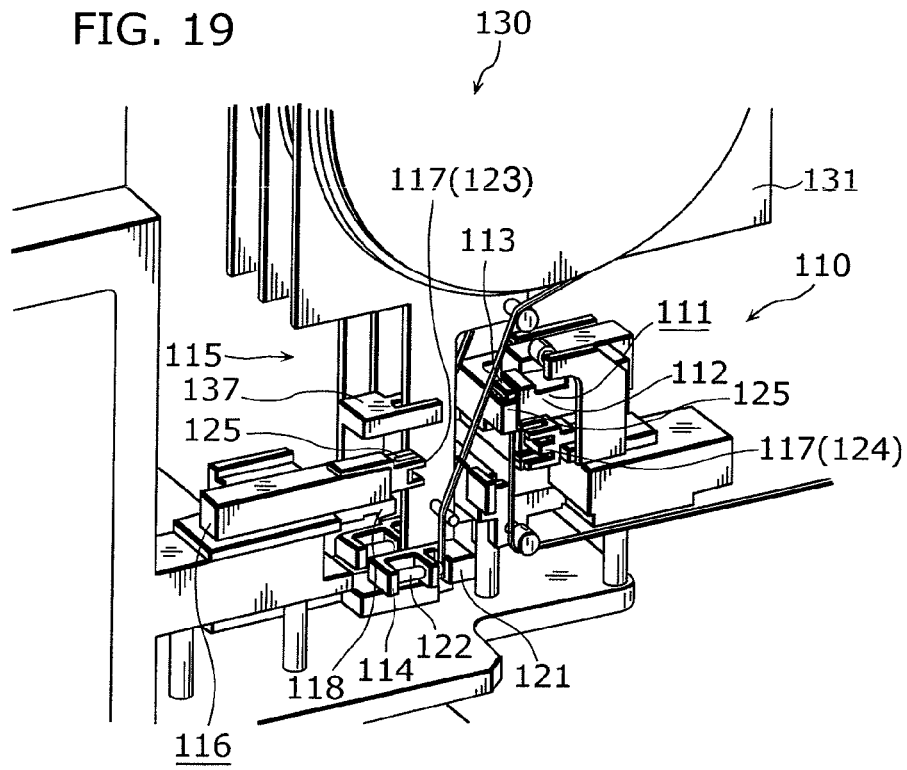
FIG. 19 illustrates an enlarged perspective view of a splicing unit and a supplying unit.

FIG. 15 is a perspective view simply illustrating an internal configuration of the attaching apparatus 100 according to the present embodiment.

As illustrated in FIG. 15, the attaching apparatus 100 is an attaching apparatus that attaches the ACF 212 supplied from the ACF tape 210 on the glass panel 200 being used as a board. The attaching apparatus 100 includes: a splicing unit (splicing apparatus) 110 that splices an terminal end of the ACF tape 210 that is being used to a beginning end of the additional ACF tape 210; a supplying unit 130 that supplies the additional ACF tape 210; a winding unit 140 that takes up the ACF tape 210 and forwards a predetermined amount of the ACF tape 210; an attaching unit 150 that attaches the ACF tape 210 on the glass panel 200; a disposing unit 170 that disposes an unnecessary portion of the ACF 212; and a transporting unit 190 that carries the glass panel 200.

The attaching unit 150 presses, to the glass panel 200, the ACF tape 210 placed on an end of the glass panel 200 so as to attach the ACF 212 to the end of the glass panel 200. The attaching unit 150 includes: a placing unit 151 that places an end of the glass panel 200 thereon and that supports the end of the glass panel 200 from an underside of the glass panel 200; and a pressing unit 152 that can be shifted in a vertical direction and can press the end of the glass panel 200 and the ACF tape 210 in a direction of the placing unit 151 by sandwiching them.

When the spliced ends of the ACF tapes 210 reach the attaching unit 150, the disposing unit 170 disposes of a portion of the ACF 212 closer to the ends of the ACF tapes 210 for determining an initial position of the ACF 212. The disposing unit 170 includes a temporary component 171 capable of freely shifting between a position provided above the placing unit 151 and a position provided at the side of the placing unit 151.

The transporting unit 190 carries an end of the glass panel 200 to the attaching unit 150. In other words, it rotates the glass panel 200 to carry the other end of the glass panel 200 to the attaching unit 150. The transporting unit 190 includes a table 191 on which the glass panel 200 is placed and which enables the glass panel 200 to be rotatable in a θ direction, and an XY robot 192 that can shift the table 191 horizontally.

FIGS. 16 to 22 are enlarged perspective views illustrating the splicing unit (splicing apparatus) 110 and the supplying unit 130.

As illustrated in the drawings, the splicing unit (splicing apparatus) 110 in the present embodiment includes the first holding unit 111, the first cutting unit 113, the second holding unit 114, the second cutting unit 118, the positioning unit 115, and the pressing unit 116.

The first holding unit 111 holds the ACF tape 210 by nipping the end of the ACF tape 210 that is to be used up, and includes two nip units 112.

Furthermore, the two nip units 112 can be projected so that the respective nip units 112 can be positioned on both sides of the ACF tape 210 in a thickness direction, and further can be taken into the first holding unit 111 when the nip units 112 do not nip the ACF tape 210.

Furthermore, disc-like elastic elements 119 are provided at faces that are closer to the ends of the two nip units 112 and oppose to the two nip units 112. The elastic elements 119 can hold the ACF tape 210 strongly without any displacement.

Note that it is possible to optionally select the presence and absence of or the shape of the elastic elements 119.

The first cutting unit 113 is provided above the elastic elements 119. One of the nip units 112 nips the ACF tape 210, while the other can cut the ACF tape 210 using the nipping force of the nip units 112. More specifically, the one of the nip units 112 is equipped with a cutting tool, and the other of the nip units 112 is equipped with a plate-like component that accepts the cutting tool. Using the force for nipping the ACF tape 210, it is possible to cut the ACF tape 210 at the reel side, not the elastic element 119 side.

The second holding unit 114 is fixed to a holding plate 131 to be described later, and holds the beginning end of the additional ACF tape 210 to be held by a reel 214 of which shaft is supported by the holding plate 131 by nipping it.

In the holding structure of the second holding unit 114, the ACF tape 210 is nipped between a cylinder 122 and a holding base 121, the cylinder 122 being urged in a direction toward a holding base 121 to be protruded, and the holding base 121 being fixed by the holding plate 131.

Since the supplying unit 130 serves as the positioning unit 115 in the present embodiment, the supplying unit 130 is to be described later.

The pressing unit 116 presses, in a thickness direction, the ends of the ACF tapes 210 that are overlapped by the positioning unit 115, and includes two pressing elements 117. Each of the ends of the pressing elements 117 includes a concave unit 123 and a convex unit 124 that are fitted together. Then, the overlapped ACF tapes 210 are nipped between an underside of the concave unit 123 and an end surface of the convex unit 124, and pressure is given.

In the present embodiment, the adhesive tape 213 is provided at the beginning end of the ACF tape 210, and given only the pressure, it becomes possible to splice the ACF tapes 210.

Furthermore, two slits 125 are provided at each of the ends of the pressing elements 117. The slit 125 has the same width as that of the ACF tape 210, and can pass through the ACF tape 210. When the ACF tapes 210 are pressed, the slit 125 guides the ACF tapes 210, and positions the ACF tapes 210 in a width direction precisely.

The second cutting unit 118 includes: a cutting tool provided under the pressing element 117 at the additional ACF tape 210 side; and a receiving plate placed in the back side of the additional ACF tape 210. When the pressing unit 116 presses the ACF tapes 210, the second cutting unit 118 cuts the additional ACF tape 210 at the second holding unit 114 side, between the cutting tool and the receiving plate.

Figure 23:
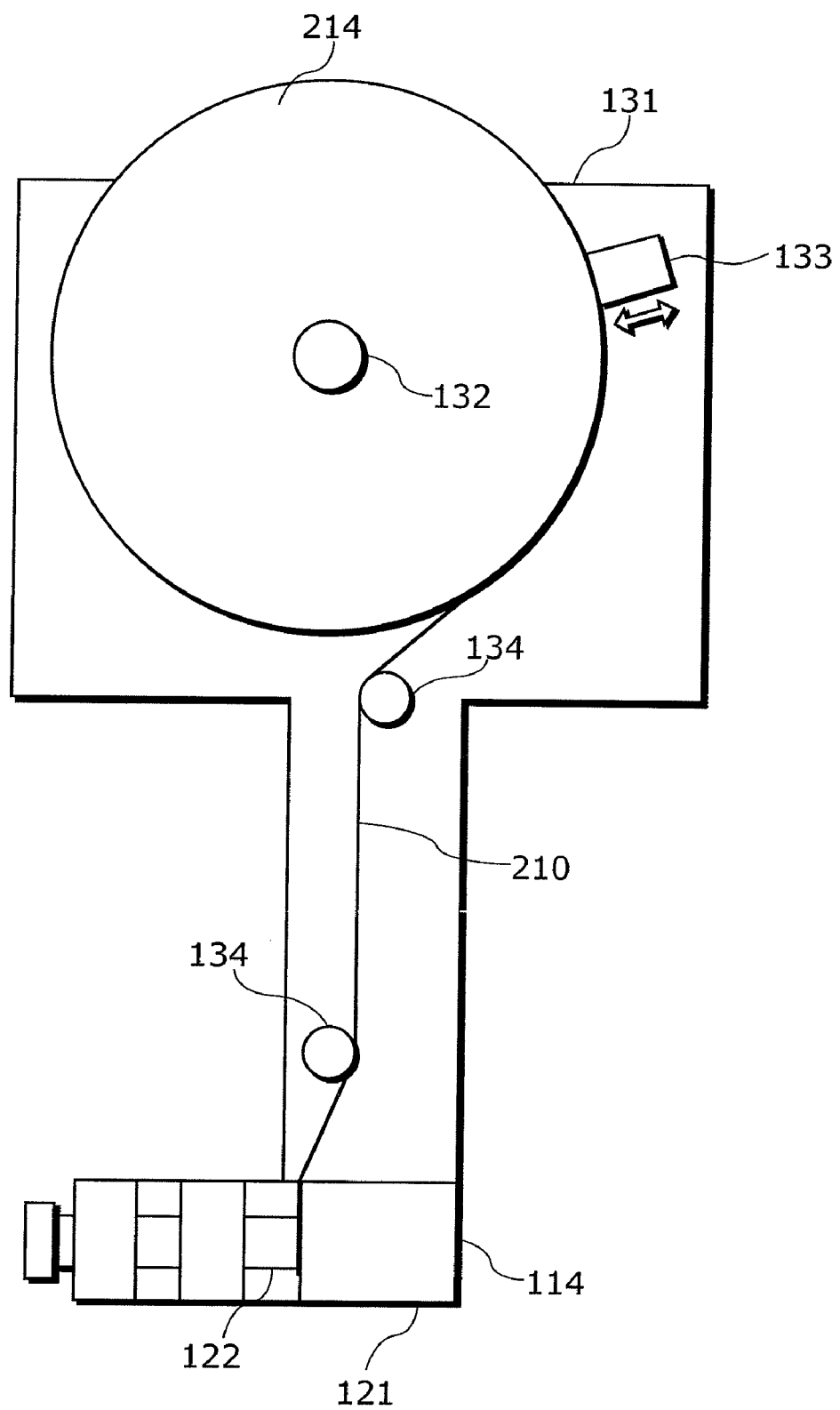
FIG. 23 is a plan view illustrating that a holding plate supports a reel and a second holding unit holds a beginning end of the ACF tape forwarded from the reel.

FIG. 23 is a plan view of the holding plate 131, and illustrates a state where the holding plate 131 supports a shaft of the reel 214 and the second holding unit 114 holds the beginning end of the ACF tape 210 forwarded from the reel 214.

The holding plate 131 illustrated in the drawing is approximately T-shaped, and the second holding unit 114 is fixed at the bottom portion of the holding plate 131. Furthermore, the holding plate 131 includes a shaft supporting unit 132, a locking unit 133, and two rollers 134.

The shaft supporting unit 132 is configured to support the reel 214 so as to allow the reel 214 to be rotated on the holding plate 131.

The locking unit 133 is slidably fixed on the holding plate 131 to be apart from and contact a peripheral line of the reel 214. When the locking unit 133 is apart from the peripheral line of the reel 214, the locking unit 133 can unlock the reel 214 to be rotatable, whereas when the locking unit 133 contacts the peripheral line of the reel 214, the locking unit 133 can lock the reel 214 against rotation.

Note that without contacting the peripheral line of the reel 214, the locking unit 133 may be disposed on a position other than the holding plate 131, and be connected to the shaft supporting unit 132 of the reel 214 through a belt and the like so as to lock the reel 214 against rotation.

The rollers 134 define a path of the ACF tape 210 forwarded from the reel 214, and are supported by the shaft of the holding plate 131 to be rotatable.

With the aforementioned configuration, the second holding unit 114 can fix, to the holding plate 131, the beginning end of the ACF tape 210 forwarded from the reel 214 spliced to the terminal end of the ACF tape 210. Furthermore, the locking unit 133 can limit the rotation of the reel 214. Thus, the ACF tape 210 is held with a proper tape tension that is optionally set, and is tightened between the two rollers 134.

The attaching apparatus 100 in the present embodiment includes two of the magazines 135 as supporting units each capable of holding five of the holding plates 131 each including the ACF tape 210 and the reel 214 fixed therein (see FIG. 15). During when the ACF tape 210 is forwarded from the reel 214 included in one of the magazines 135, the other one of the magazines 135 can be detached from and attached to the attaching apparatus 100.

Thus, during when one of the magazines 135 is used, in other words, when the attaching apparatus 100 operates, the one of the magazines 135 can be replaced with another one of the magazines 135. Accordingly, since the additional ACF tape 210 can be loaded to the magazine 135 outside the attaching apparatus 100, and the magazine 135 can be set in the attaching apparatus 100, there is no need to suspend operations of the attaching apparatus 100 for setting the additional ACF tapes 210.

Furthermore, the magazines 135 are frames that hold the holding plates 131 parallel and at regular intervals, and are fixed to the magazine shifting unit 136 in a detachable manner.

The magazine shifting unit 136 has a configuration capable of shifting the magazines 135 in a thickness direction of the holding plates 131 parallel, using a driving unit, such as ball screws. Furthermore, a feedback control of an encoder allows a position of the magazines 135 to be controlled to a predetermined precision.

The supplying unit 130 includes the magazine shifting unit 136, the magazines 135, and the holding plates 131. In other words, when the entire ACF tape 210 is completely forwarded from one of the reels 214 with this supplying unit 130, the magazine shifting unit 136 shifts the magazines 135 parallel, and the additional ACF tape 210 is set in a supply position.

Further, this supplying unit 130 includes the plate fixing unit 137 that fixes the holding plate 131 by nipping it (see FIGS. 16 to 22). The plate fixing unit 137 fixes the holding plate 131 by nipping the bottom portion of the holding plate 131 except for when the magazine 135 is shifted. When the magazine 135 is shifted, the plate fixing unit 137 is also shifted, thus releasing the fixed position of the holding plates 131.

Furthermore, this supplying unit 130 serves as the positioning unit 115. In other words, setting the additional ACF tape 210 in a supply position by shifting the magazine 135 using the magazine shifting unit 136 corresponds to setting the ends of the ACF tapes to be overlapped in a thickness direction by shifting the holding plate 131.

Note that although the magazines 135 including the holding plate 131 that are detachable are used as supporting units in the present embodiment, the supporting units may be anything as long as the holding plates 131 are fixed and supported.

Figure 24:
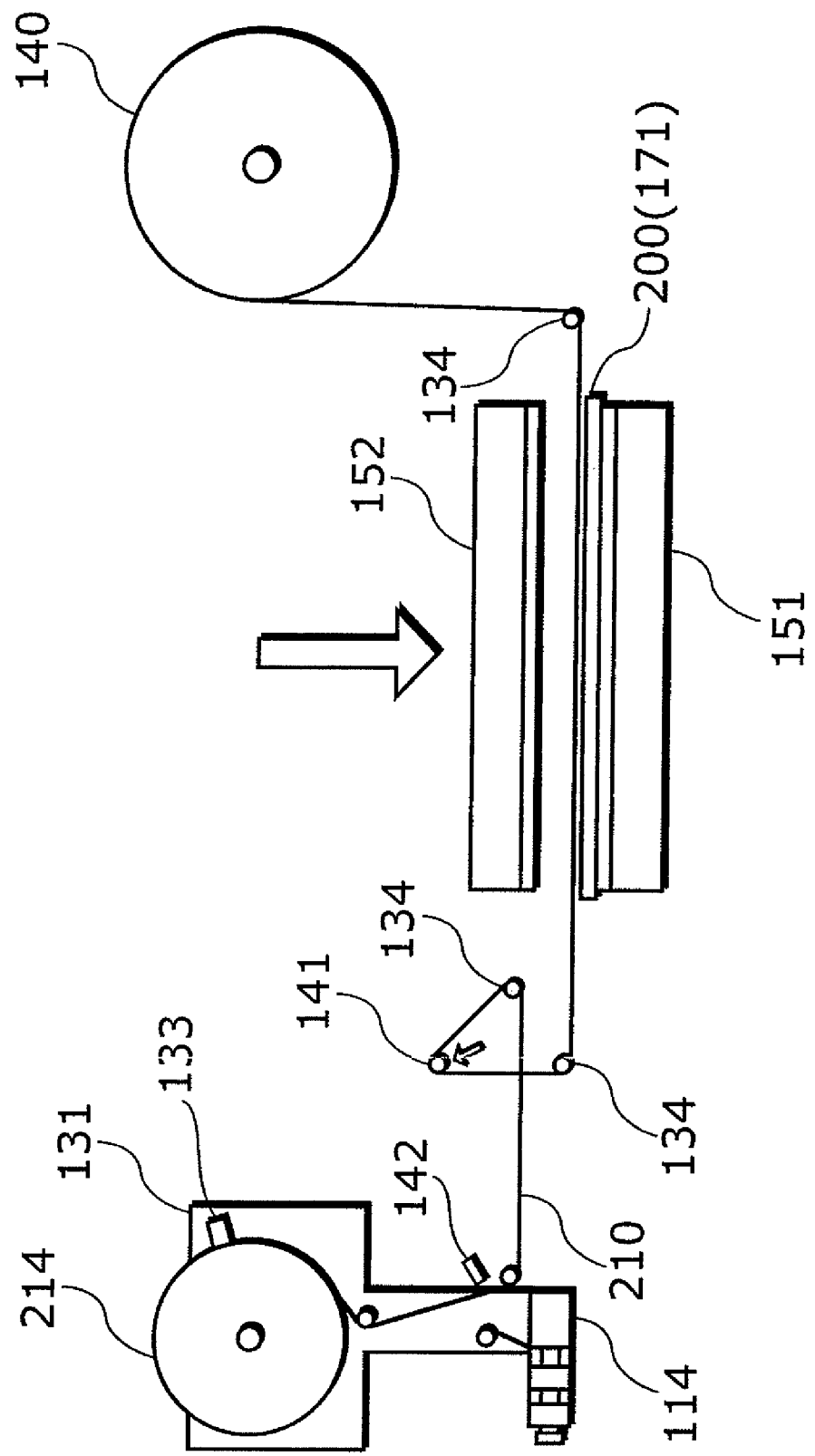
FIG. 24 is a side view schematically illustrating a path of the ACF tape.

FIG. 24 is a side view schematically illustrating a path of the ACF tape 210.

As illustrated in FIG. 24, the rollers 134 are provided at turning points, and a predetermined tape path can be set by passing the ACF tape 210 through these rollers 134.

Furthermore, the attaching apparatus 100 includes a tension roller 141 among one of the rollers 134. This tension roller 141 is above the path of the ACF tape 210, and is one of the rollers 134 that is urged in a predetermined direction to provide a fixed tension to the ACF tape 210.

Furthermore, the attaching apparatus 100 includes an ACF detector 142 for detecting an end of the ACF 212 provided on the ACF tape 210, near the holding plate 131 through which the tape passes. This ACF detector 142 is a sensor that detects an ACF or an adhesive tape by detecting reflection of rays of light or a light transmission status.

Furthermore, the attaching apparatus 100 includes the winding unit 140. As illustrated in the drawing, this winding unit 140 includes the reel 214 that can take up the ACF tape that has been used up, and has a configuration capable of forwarding a predetermined amount of the ACF tape 210.

Note that the attaching apparatus 100 may adopt any configuration that allows vacuum absorption or storage in a box, besides installation of the winding unit 140.

The attaching apparatus 100 can supply the ACF tapes 210 held in the attaching apparatus 100 in order. Since the additional tape 210 can be spliced to the ACF tape 210 that is being used, it becomes possible to operate the attaching apparatus 100 without suspending the operations for supplying the additional ACF tapes 210.

In addition, when the additional ACF tape 210 is spliced to the ACF tape 210 that is being used, a tape path can be set by only taking up the ACF tape 210 that is being used so that the additional ACF tape 210 follows it. Thus, there is no need to provide any large-scale apparatus that automatically sets a complicated tape path. This prevents upsizing of the apparatuses and increase in device costs.

Note since the ACF tape 210 includes the adhesive tape 213 for bridging a gap in the ACF tape 210, the ACF tapes 210 can be spliced using the pressing unit 116. However, the present invention is not limited to this. For example, an ultrasonic transducer or a thermal splicing unit may be provided at the end of the pressing element 117 so that the ends of the ACF tapes 210 may be ultrasonically or thermally spliced.

Furthermore, although the ACF tape 210 is cut for releasing the ACF tape 210 from the second holding unit 114, the ACF tape 210 may be released by causing the second holding unit 114 to stop holding the ACF tape 210.

Furthermore, since the attaching apparatus 100 holds the large amount of the ACF tape 210 for a long period of time, the ACF 212 may be degraded. In order to prevent the degradation, a cooling device may be provided near the magazines 135.

Next, additional processes of the ACF tape 210 in the attaching apparatus 100 having the aforementioned configuration are described.

Figure 25:
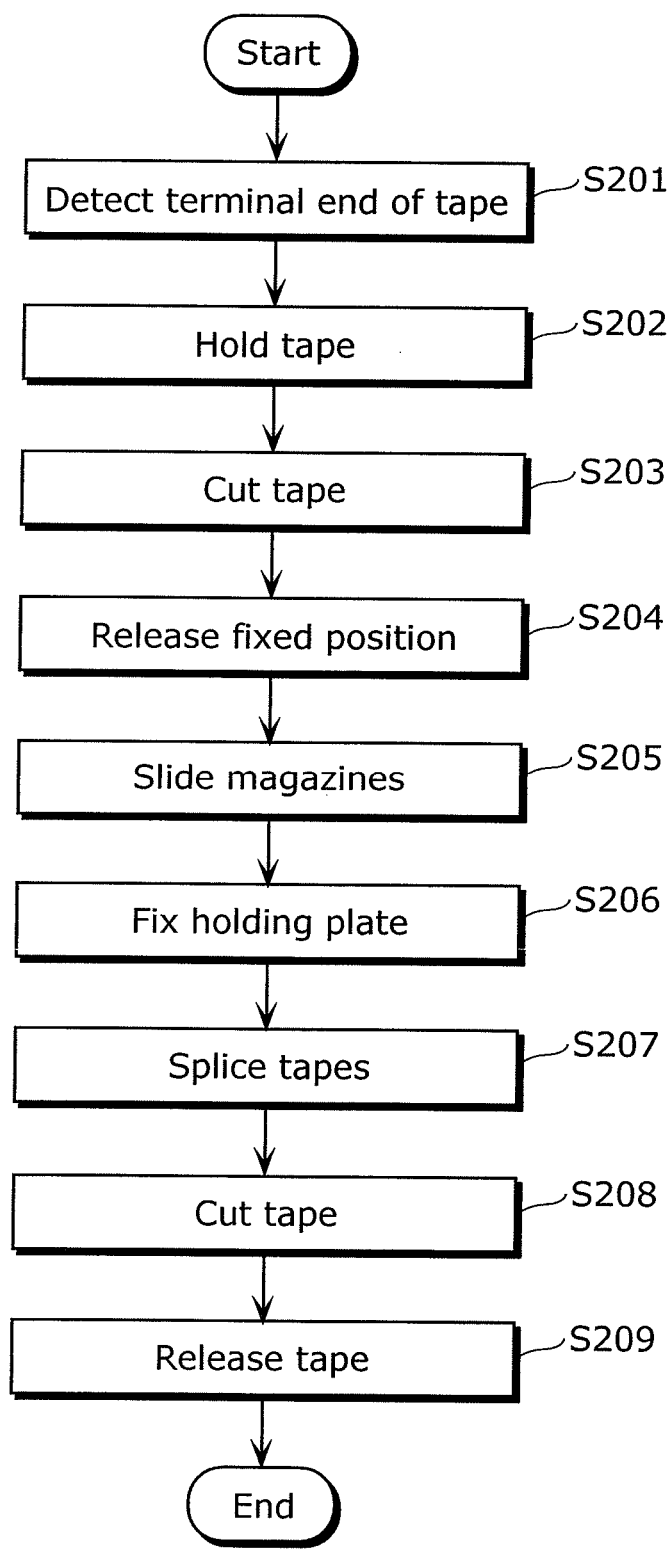
FIG. 25 is a flowchart illustrating additional processes of the ACF tape.

FIG. 25 is a flowchart illustrating additional processes of the ACF tape 210.

Detection of a terminal end of the ACF 212 in the ACF tape 210 using the ACF detector 142 triggers start of the additional processes of the ACF tape 210.

Next, the first holding unit 111 protrudes (see FIG. 17), and holds the end of the ACF tape 210 that is being used by nipping it (S202). Simultaneously, the first cutting unit 113 cuts a portion of the ACF tape 210 closer to the reel 214 (S203) (see FIG. 18). Since the tension roller 141 operates even in this state, the ACF tape 210 that is being used has a fixed tension.

Next, after the fixed position of the holding plate 131 is released by sliding the plate fixing unit 137 (S204), the magazine sliding unit 136 causes the magazines 135 to slide so that the next holding plate 131 is set in a supply position (S205). Then, re-shift of the plate fixing unit 137 causes the new holding plate 131 to be fixed (S206) (see FIG. 19).

With the aforementioned processes, it becomes possible to overlap a terminal end of the ACF tape 210 that is being used and a beginning end of the additional ACF tape 210 precisely in a thickness direction. In addition, the first holding unit 111 holds the terminal end of the ACF tape having a fixed tension with use of the tension roller 141. The second holding unit 114 holds the beginning end of the additional ACF tape 210 having a fixed tape path by the rollers 134, and the additional ACF tape 210 maintains the fixed tension because the locking unit 133 locks the reel 214 against rotation. Thus, the position of the overlapped ACF tapes 210 in a width direction can be controlled precisely.

Figure 20:
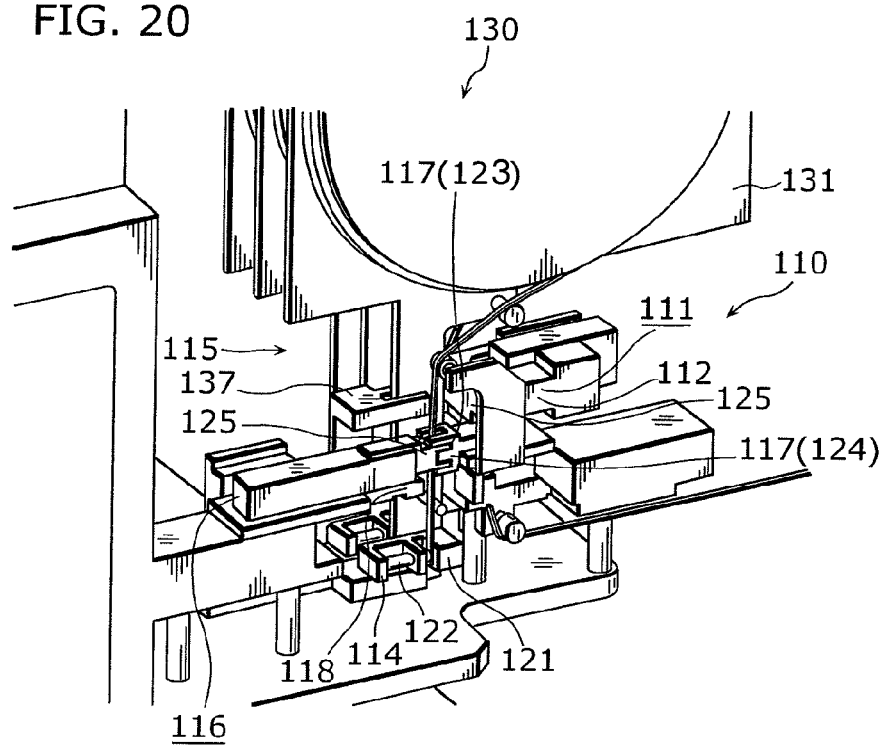
FIG. 20 illustrates an enlarged perspective view of a splicing unit and a supplying unit.

Next, the pressing element 117 at the additional ACF tape 210 side shifts to contact the additional ACF tape 210, while the pressing element 117 at the opposite side presses the ACF tape 210 that is being used to the additional ACF tape 210 to splice the ends of the ACF tapes 210 (S207) (see FIG. 20).

Figure 21:
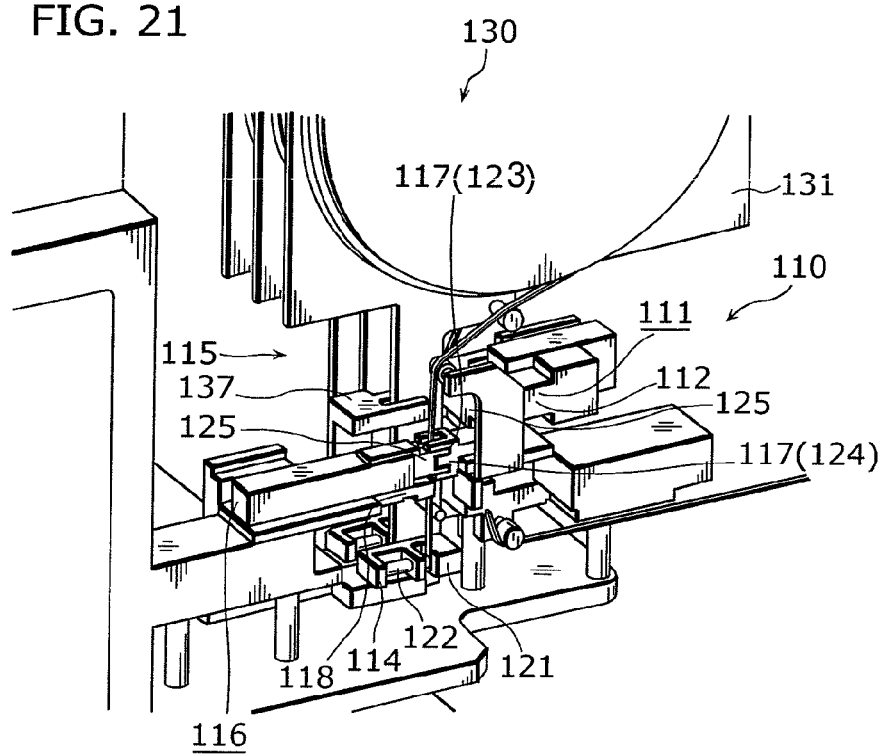
FIG. 21 illustrates an enlarged perspective view of a splicing unit and a supplying unit.

Note that although in FIGS. 20 and 21, the ACF tape 210 that is being used is illustrated halfway, this is only a matter of making the drawings. Actually, the cut end of the ACF tape 210 is nipped by the two nip units 112.

In this process, when the ACF tape 210 that is being used is forwarded, the tension roller 141 serves as a tension maintaining unit that maintains a fixed tension of the ACF tape 210. Thus, any distortion or elongation in the ACF tape 210 hardly occurs, so that the ACF tapes can be spiced without any displacement in a width direction.

Furthermore, after the splicing (S207), the second cutting unit 118 cuts the additional ACF tape 210 at the second holding unit 114 side (S208) (see FIG. 21).

Figure 22:
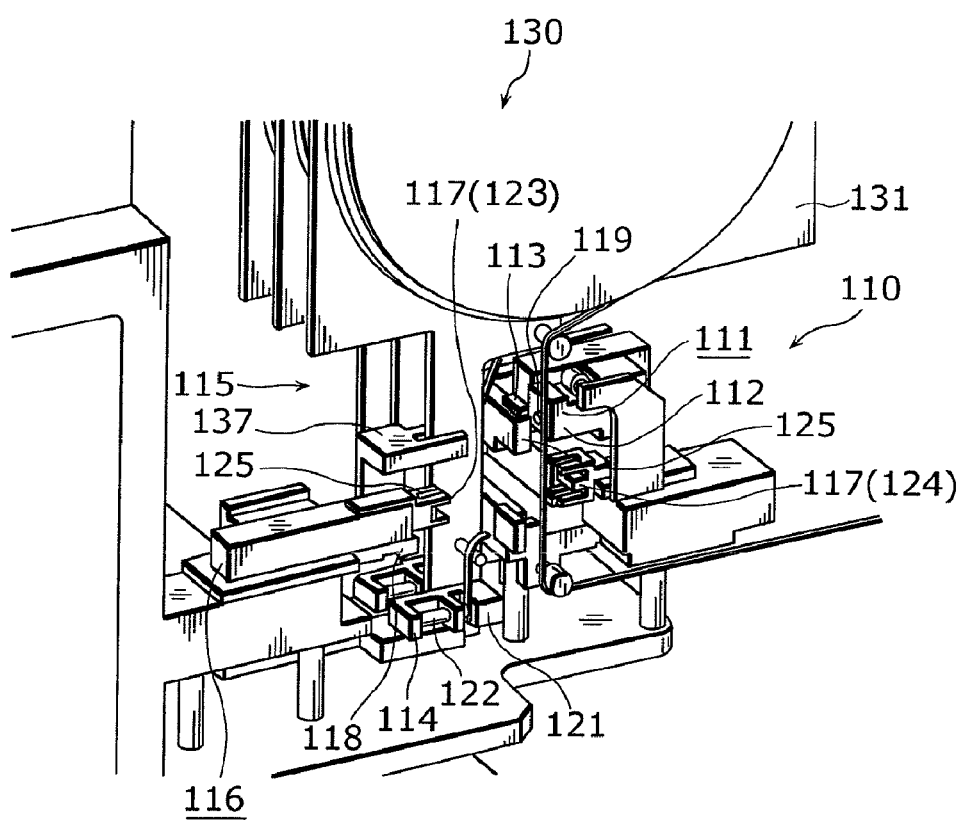
FIG. 22 illustrates an enlarged perspective view of a splicing unit and a supplying unit.

Finally, the ACF tape 210 is released by setting the first holding unit 111 and the pressing unit 116 apart (S209) (see FIG. 22).

Figure 26:
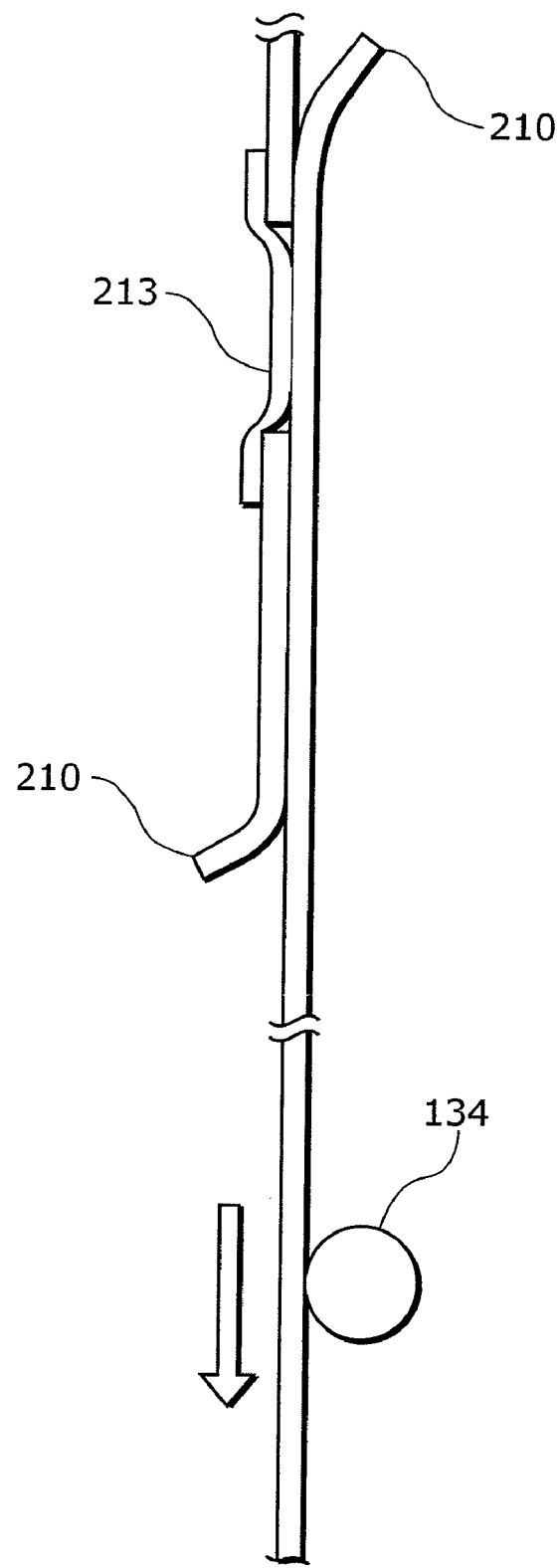
FIG. 26 illustrates a side view of the ACF tapes to be spliced.

As illustrated in FIG. 26, the beginning end of the additional ACF tape 210 is spliced to the terminal end of the ACF tape 210 that is being used.

Furthermore, even when the ACF tape 210 is forwarded to an arrow direction in the drawing, an end of the ACF tape 210 that is not spliced to the other one of the ACF tapes 210 is never stuck in the roller 134. This is because the base tapes 211 are spliced with the adhesive tape 213 from a side including the ACF 212 in order to splice the ACF tapes 210 together.

Next, disposing processing after the additional ACF tape 210 has been spliced is described.

Figure 27:
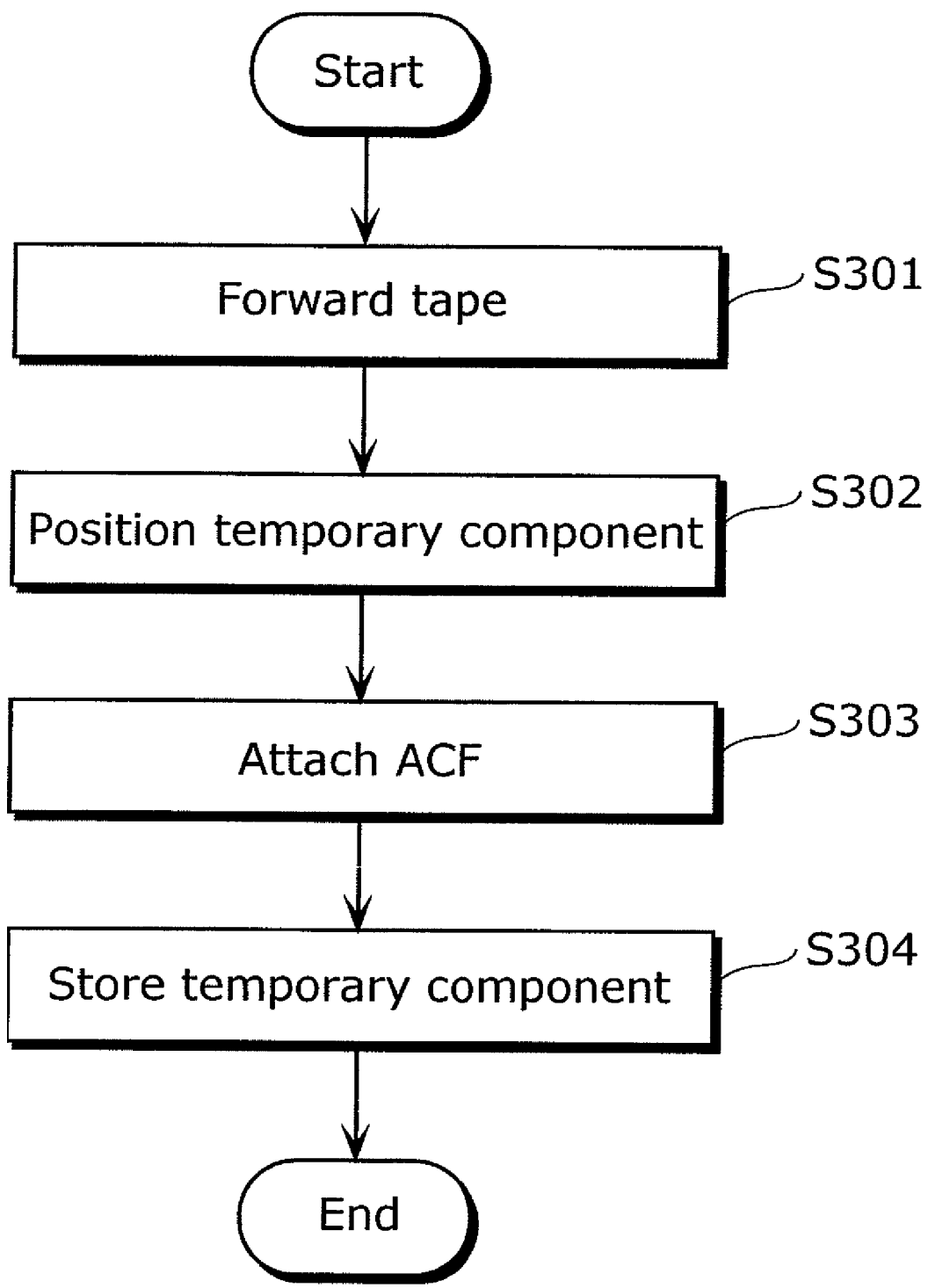
FIG. 27 is a flowchart of disposing processing after an additional ACF tape has been spliced.

FIG. 27 is a flowchart of the disposing processing after the additional ACF tape 210 has been spliced.

Figure 28:
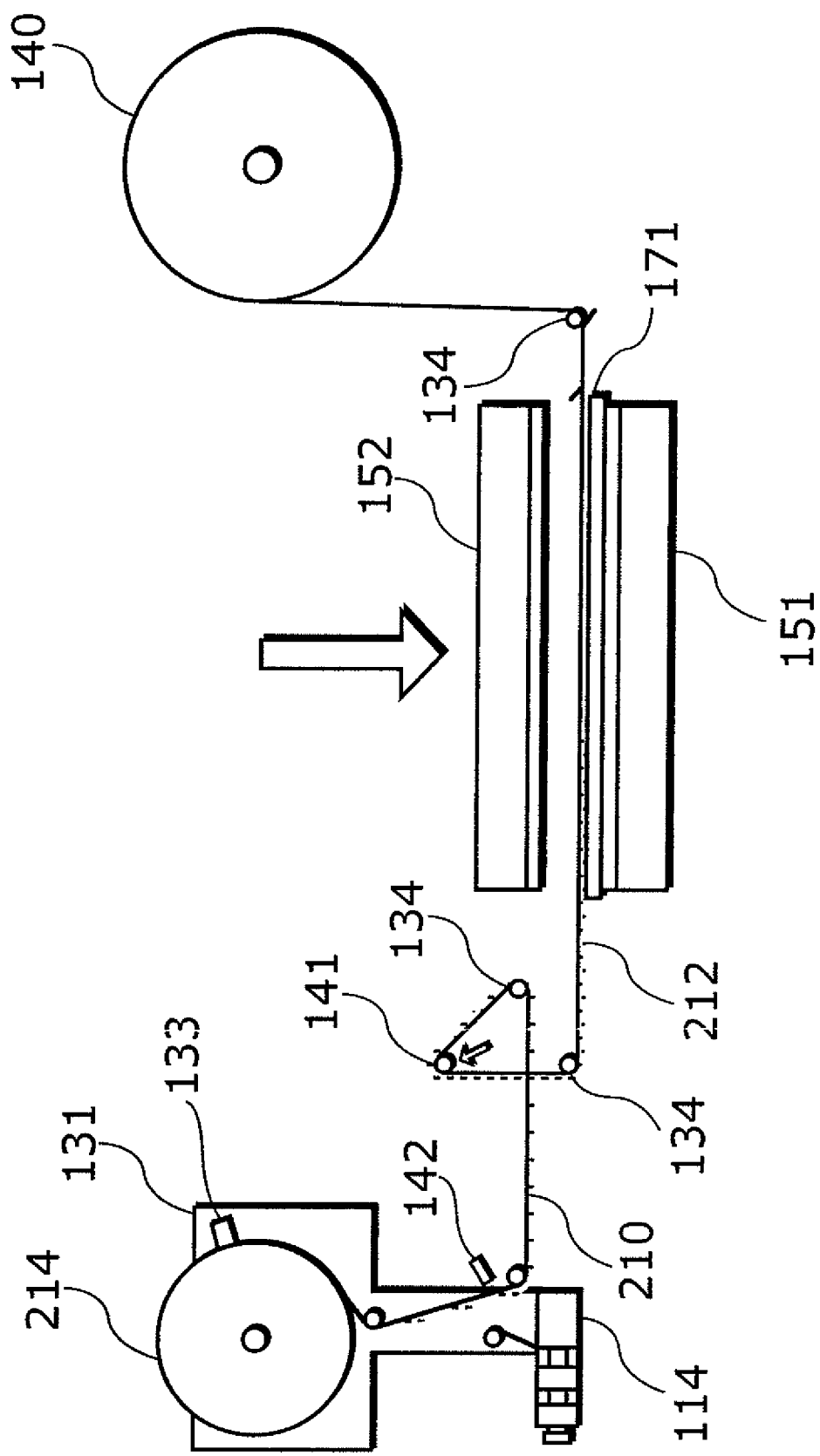
FIG. 28 is a side view schematically illustrating the attaching apparatus that is performing disposing processing.

The spliced ACF tape 210 is forwarded to a predetermined position by a winding machine and the like (S301) (FIG. 28).

Next, the temporary component 171 is positioned above the placing unit 151 from the placing unit 151 side by sliding it (S302).

Next, the pressing unit 152 is lowered, and the pressing unit 152 and the placing unit 151 press the temporary component 171 and the ACF tape 210 at the same time by sandwiching them. With this, the ACF 212 provided on the ACF tape 210 is attached on the temporary component 171 (S303).

The disposing processing ends after the pressing unit 152 is raised, and the temporary component 171 is stored in the original position, namely the placing unit 151 side (S304).

With the disposing processing, it becomes possible to clarify a position of the end of the ACF 212 provided on the additional ACF tape 210, and to precisely attach the ACF 212 in the following processes. In other words, when the end of the ACF 212 is detected only by a sensor, an error that cannot be overlooked occurs in a position where the ACF tape 210 is stopped, due to response time of the sensor and the like. Thus, the disposing processing is performed.

Although the present embodiment exemplifies the ACF tape 210 as a tape, the tape is not limited to this. For example, the ACF tape 210 may be a tape including a Non Conductive Film (NCF) and the like.

The present invention is applicable to a splicing apparatus that splices tapes, such as ACF tapes. Furthermore, the present invention is applicable to an attaching apparatus that attaches an adhesive material supplied from a tape on a board, and to an attaching apparatus that attaches the ACF on a glass panel using the ACF tape.

The invention claimed is:

1. An Anisotropic Conductive Film (ACF) attaching method for attaching an ACF on a board by supplying, above the board, an ACF tape having a base tape and the ACF on one side of the base tape except at a terminal end and a beginning end of the base tape, wherein the beginning end is located downstream of the terminal end, cutting the ACF to a predetermined length, and pressing the ACF tape to the board, said attaching method in the case where one of the ends of the ACF tape that is being used is detected, said attaching method comprising:
    holding, by a first holding unit, the terminal end of the base tape included in the ACF tape that is being used such that the ACF tape that is being used is held under tension;
    cutting, at a cutting location of the base tape, the terminal end of the base tape upstream from the first holding unit so as to leave a remainder terminal end part of the base tape downstream of the cutting location;
    holding, by a second holding unit separate from the first holding unit, a beginning end of an additional base tape included in an additional ACF tape such that the additional base tape is held under tension;
    positioning the remainder terminal end part of the base tape that is being used and the beginning end of the additional base tape to be mutually overlapped in a thickness direction between the first holding unit and the second holding unit, such that the remainder terminal end part of the base tape that is being used is precisely aligned in a width direction with the beginning end of the additional base tape;
    pressing the overlapped ends of the ACF tapes in the thickness direction to cause splicing of the ACF tapes to thereby form a spliced ACF tape having a spliced portion constituted by the remainder terminal end part and the beginning end that are mutually overlapped; and
    cutting the beginning end of the additional base tape between the spliced portion of the spliced ACF tape and the second holding unit,
    wherein said attaching method is repeated using additional ACF tapes.

2. The attaching method according to claim 1, further comprising:
    forwarding a predetermined length of the additional ACF tape, as the spliced ACF tape is being used; and
    attaching the ACF on a temporary component different from the board.

3. The attaching method according to claim 1, wherein said pressing of the overlapped ends is carried out by a pressing unit at a location upstream of the second holding unit and downstream of the first holding unit.

* * * * *